(12) United States Patent
Kunori et al.

(10) Patent No.: US 7,573,109 B2
(45) Date of Patent: Aug. 11, 2009

(54) SEMICONDUCTOR DEVICE

(75) Inventors: Shinji Kunori, Saitama (JP); Hiroaki Shishido, Saitama (JP); Masato Mikawa, Saitama (JP); Kosuke Ohshima, Saitama (JP); Masahiro Kuriyama, Saitama (JP); Mizue Kitada, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 527 days.

(21) Appl. No.: 11/528,654

(22) Filed: Sep. 28, 2006

(65) Prior Publication Data

US 2007/0069323 A1 Mar. 29, 2007

Related U.S. Application Data

(63) Continuation of application No. PCT/JP2005/004178, filed on Mar. 10, 2005.

(30) Foreign Application Priority Data

Mar. 29, 2004 (JP) ............................ 2004-095754

(51) Int. Cl.
*H01L 29/76* (2006.01)
(52) U.S. Cl. ...................................... 257/401; 257/331
(58) Field of Classification Search ................. 257/124, 257/133, 137, 138, 139, 141, 330, 331, 401
See application file for complete search history.

(56) References Cited

U.S. PATENT DOCUMENTS

2002/0179942 A1* 12/2002 Tihanyi ...................... 257/213

FOREIGN PATENT DOCUMENTS

| DE | 198 18 299 A1 | 11/1999 |
| DE | 100 52 170 A1 | 5/2002 |
| JP | 8-167713 | 6/1996 |
| JP | 2003-069016 | 3/2003 |
| JP | 2003-101021 | 4/2003 |

OTHER PUBLICATIONS

Supplementary European Search Report dated Jul. 22, 2008.

* cited by examiner

*Primary Examiner*—Thomas L Dickey
(74) *Attorney, Agent, or Firm*—Kratz, Quintos & Hanson, LLP

(57) ABSTRACT

A semiconductor device having high withstand strength against destruction. The semiconductor device 1 includes guard buried regions 44b of second conductivity type concentrically provided on a resistance layer 15 of first conductivity type and base diffusion regions 17a are provided inside of the guard buried region 44b and base buried regions 44a of the second conductivity type are provided on the bottom surface of the base diffusion regions 17a. A distance between adjacent base buried regions 44a at the bottom of the same base diffusion region 17a is $Wm_1$, a distance between adjacent base buried regions 44a at the bottom of the different base diffusion regions 17a is $Wm_2$, and a distance between the guard buried regions 44b is $W_{PE}$. A ratio of an impurity quantity $Q_1$ of the first conductivity type and an impurity quantity $Q_2$ of the second conductivity type included inside the widthwise center of the innermost guard buried region 44b is $0.90 < Q_2/Q_1$ when $Wm_1 < W_{PE} < Wm_2$. When $W_{PE} < Wm_1 < Wm_2$, the ratio is $Q_2/Q_1 < 0.92$ and when $Wm_1 < Wm_2 < W_{PE}$, the ratio is $1.10 < Q_2/Q_1$.

14 Claims, 21 Drawing Sheets

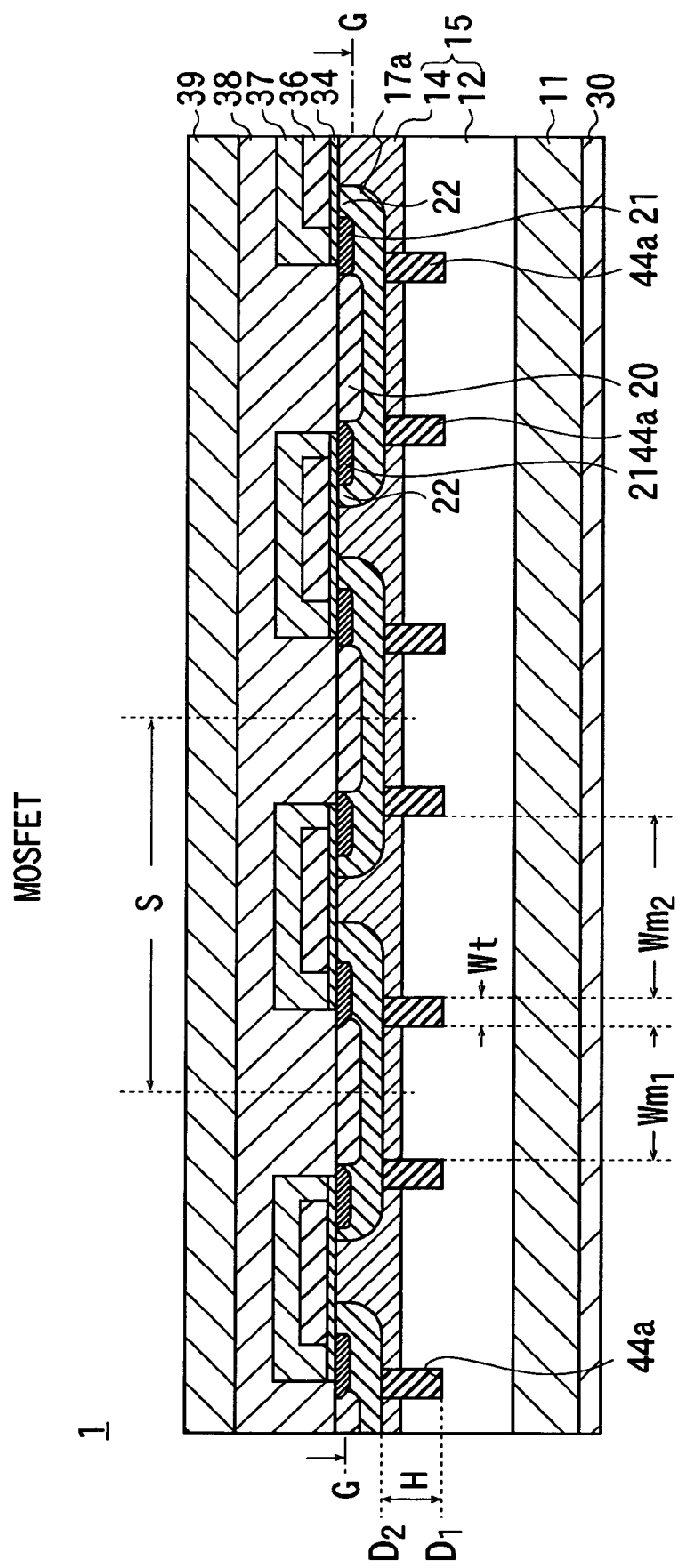

SEMICONDUCTOR DEVICE

This is a Continuation of International Application No. PCT/JP2005/004178 filed Mar. 10, 2005. The entire disclosure of the prior application is hereby incorporated by reference herein in its entirety.

BACKGROUND OF THE INVENTION

1. Field of the Invention

The present invention generally relates to a technique of increasing the withstand voltage of a semiconductor device, and more particularly, to a technique of increasing the withstand voltage and providing higher withstand strength against destruction.

2. Discussion of the Relevant Art

In the technical field of power semiconductor devices, RESURF structure devices have been studied as promising means for achieving increased withstand voltage.

The reference numeral 101 in FIG. 38 denotes a conventional MOSFET type semiconductor device, in which an N type resistance layer 112 having a large resistance value is epitaxially grown on an N-type substrate 111 having a small resistance value.

At the inner surface of the resistance layer 112, a plurality of P-type guard regions 146b whose two-dimensional shape is a square ring are concentrically formed.

In the region surrounded by the innermost guard region 146b, a plurality of long and narrow P-type base diffusion regions 117 are formed, and a long and narrow P-type Ohmic diffusion region 120 having a higher surface concentration than that of the base diffusion region 117 is provided in the widthwise center of the inside surface of each of the base diffusion regions 117.

A long and narrow N-type source diffusion region 121 is provided parallel to the Ohmic diffusion region 120 on either side of the Ohmic diffusion region 120 on the inside surface of the base diffusion region 117.

At the inside surface of the base diffusion region 117, the part between the outer periphery of the source diffusion region 121 and the outer periphery of the base diffusion region 117 forms a channel region 122, on which a gate insulating film 134 and a gate electrode film 136 are provided in the above-mentioned order.

An interlayer insulating film 137 is provided on the gate electrode film 136, and a source electrode film 138 in contact with the source diffusion region 121 and the Ohmic diffusion region 120 is provided on the interlayer insulating film 137. The source electrode film 138 is isolated from the gate electrode film 136 by the interlayer insulating film 137.

Therefore, the source electrode film 138 is insulated from the gate electrode film 136, and the source electrode film 138 is electrically connected to the source diffusion region 121 and also electrically connected to the base diffusion region 117 through the Ohmic diffusion region 120. A protective film 139 is formed on the surface of the source electrode film 138.

The drain electrode film 130 is formed on the back surface of the substrate 111. As the source electrode film 138 is grounded, a positive voltage is applied to the drain electrode film 130 and a voltage equal to or larger than the threshold voltage is applied to the gate electrode film 136 so that the channel region 122 inverted to N-type, and the source diffusion region 121 and the resistance layer 112 are connected to the inversion layer. This state is a conduction state, in which current flows from the drain electrode film 130 to the source electrode film 138.

Once the gate electrode film 136 attains a potential equal to that of the source electrode film 138, the inversion layer disappears. As a result, current no longer flows so that a cutoff state is attained.

A P-type base buried region 146a is provided at the bottom of the base diffusion region 117 in contact with the base diffusion region 117. In the cutoff state, a PN junction between the P-type region including the base diffusion region 117 and the base buried region 146a and the N-type region including the resistance layer 112 is reversely biased so that depletion layers greatly expand from both PN junctions in the base diffusion region 117 and the base buried layer 146a toward both the P-type region and the N-type region.

The base buried region 146a is a long and narrow region that extends in the extending direction of the long and narrow base diffusion region 117 and is provided in the widthwise center of each of the base diffusion regions 117.

The base diffusion regions 117 are provided parallel to one another and the base buried regions 146a are positioned parallel to one another. The depletion layers extending laterally from the base buried regions 146a are connected in the central position between the adjacent base buried regions 146a in the central position so that the resistance layer 112 between the base buried regions 146a is filled with the depletion layer.

When the depletion layer extending laterally outwardly from the base buried region 146a and the base diffusion region 117 reach the guard region 146b, the depletion layer start to expand from the guard region 146b.

If the quantity of the N-type impurity and the quantity of P-type impurity contained in the RESURF region on the inside the widthwise center of the innermost guard region 146b and positioned between the bottom of the base buried region 146a and the bottom of the base diffusion region 117 are set to be equal. When the exact amount of voltage that causes the N-type region in the RESURF region to be filled with depletion layer is applied, the P-type region in the RESURF region is filled with the depletion layer as well.

In this state, the bottom surface of the depletion layer in the RESURF region is flat, and therefore if voltage larger than the voltage is applied and the depletion layer expands toward the substrate 111 beyond the bottom of the base buried region 146a, it appears as if the depletion layer has expanded from a planer junction, which advantageously raises the withstand voltage. The quantities of impurities and the diffusion structure that allow such depletion layers to form are called "RESURF condition."

These relevant arts are disclosed in Japanese Patent Laid-Open Publication No. 2003-101022 and Japanese Patent Laid-Open Publication No. 2003-86800.

SUMMARY OF THE INVENTION

The semiconductor device having the above-described structure has high withstand voltage, but once large reverse-bias is applied, avalanche breakdown occurs.

Avalanche breakdown could destroy the semiconductor device 101; and therefore, there has been a demand for a semiconductor device having high withstand voltage and high withstand strength against destruction.

There are two cases of which avalanche breakdown occurs in an active region inside the innermost guard region 146b for one case, and in a withstand voltage region on outside of the active region for the other case.

Since the guard region 146b is set at a floating potential, when avalanche breakdown occurs in the withstand voltage region, current passed by the avalanche breakdown concentrates around the base diffusion region 117 in the vicinity of the innermost guard region 146b, which destroys the semiconductor device 101.

Meanwhile, if avalanche breakdown occurs in the active region, current is passed to a wide region at the bottom of the base diffusion region 117, and if current that is destructive in the withstand voltage region is passed in response, avalanche breakdown generated in the active region dose not destroy the device.

The inventors have found that a semiconductor device having high withstand strength against destruction can be obtained while the RESURF condition in the region having the base region is satisfied, if the relationship between a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions are set appropriately.

The present invention was made based on the above-described findings. A semiconductor device of the invention includes a resistance layer of a first conductivity type, a plurality of guard buried regions of a second conductivity type formed inside the resistance layer and concentrically disposed, a plurality of base diffusion regions of the second conductivity type disposed inside of an innermost guard buried region and the base diffusion region is positioned in the vicinity of an inside surface of the resistance layer, a source diffusion region of the first conductivity type formed in the vicinity of an inner surface of each of the base diffusion regions and the source diffusion region is positioned inside region of an edge of each of the base diffusion regions and having a depth shallower than each of the base diffusion regions, a channel region in the vicinity of the edge of each of the base diffusion regions and between the edge of each of the base diffusion regions and an edge of each of the source diffusion regions, a gate insulating film positioned at least on each of the channel regions, a gate electrode film positioned on the gate insulating film, and a plurality of base buried regions of the second conductivity type and a set of a plurality of the base buried regions is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions at a position deeper than the bottom of the base diffusion region have a relationship represented by the following expression (a):

$$Wm_1 < W_{PE} < Wm_2 \quad (a);$$

the bottom of each of the base buried regions and the bottom of each of the guard buried regions are positioned substantially in the same depth; the bottoms of the respective base diffusion regions are positioned substantially in the same depth; and an impurity quantity $Q_1$ of the first conductivity type and an impurity quantity $Q_2$ of the second conductivity type included in the region on the inside of a widthwise center of the innermost guard buried region and between the bottoms of the base buried region and the guard buried region and the bottom of the base diffusion region have a relationship represented by the following expression (b):

$$0.90 < Q_2/Q_1 \quad (b).$$

A semiconductor device according to the invention includes a resistance layer of a first conductivity type, a plurality of guard buried regions of a second conductivity type formed inside the resistance layer and concentrically disposed, a plurality of base diffusion regions of the second conductivity type disposed inside of an innermost guard buried region and the base diffusion region is positioned in the vicinity of an inside surface of the resistance layer, a source diffusion region of the first conductivity type formed in the vicinity of an inner surface of each of the base diffusion regions and the source diffusion region is positioned inside region of an edge of each of the base diffusion regions and having a depth shallower than each of the base diffusion regions, a channel region in the vicinity of the edge of each of the base diffusion regions and between the edge of each of the base diffusion regions and an edge of each of the source diffusion regions, a gate insulating film positioned at least on each of the channel regions, a gate electrode film positioned on the gate insulating film, and a plurality of base buried regions of the second conductivity type and a set of a plurality of the base buried regions is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions in a position deeper than the bottom of the base diffusion region have a relationship represented by the following expression (c):

$$W_{PE} < Wm_1 < Wm_2 \quad (c);$$

the bottom of each of the base buried regions and the bottom of each of the guard buried regions are positioned substantially in the same depth; the bottoms of the respective base diffusion regions are positioned substantially in the same depth; and an impurity quantity $Q_1$ of the first conductivity type and an impurity quantity $Q_2$ of the second conductivity type included in a region inside of a widthwise center of the innermost guard buried region and between the bottoms of the base buried region and the guard buried region and the bottom of the base diffusion region have a relationship represented by the following expression (d):

$$Q_2/Q_1 < 0.92 \quad (d).$$

Furthermore, a semiconductor device according to the invention includes a resistance layer of a first conductivity type, a plurality of guard buried regions of a second conductivity type formed inside the resistance layer and concentrically disposed, a plurality of base diffusion regions of the second conductivity type disposed inside of an innermost guard buried region and the base diffusion region is positioned in the vicinity of an inside surface of the resistance layer, a source diffusion region of the first conductivity type formed in the vicinity of an inner surface of each of the base diffusion regions and the source diffusion region is positioned inside region of an edge of each of the base diffusion regions and having a depth shallower than each of the base diffusion regions, a channel region in the vicinity of the edge of each of the base diffusion regions and between the edge of each of the base diffusion regions and an edge of each of the source diffusion regions, a gate insulating film positioned at least on each of the channel regions, a gate electrode film positioned on the gate insulating film, and a plurality of base buried regions of the second conductivity type and a set of a plurality of the base buried regions is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions at a position deeper than the bottom of the base diffusion region have a relationship represented by the following expression (e):

$$Wm_1 < Wm_2 < W_{PE} \qquad (e);$$

the bottom of each of the base buried regions and the bottom of each of the guard buried regions are positioned substantially in the same depth; the bottoms of the respective base diffusion regions are positioned substantially in the same depth; and an impurity quantity $Q_1$ of the first conductivity type and an impurity quantity $Q_2$ of the second conductivity type included in a region inside of a widthwise center of the innermost guard buried region and between the bottoms of the base buried region and the guard buried region and the bottom of the base diffusion region have a relationship represented by the following expression (f):

$$1.10 < Q_2/Q_1 \qquad (f).$$

In the semiconductor device of this invention, each of the guard buried regions has a ring-shaped groove formed in the resistance layer and a semiconductor material of the second conductivity type filled in the ring-shaped groove.

In the semiconductor device according to the invention, each of the base buried regions has a groove formed in the resistance layer and a semiconductor material of the second conductivity type filled in the groove.

In the semiconductor device according to the invention, a guard diffusion region of the second conductivity type having a width larger than that of the guard buried region is disposed on the top of each of the guard buried regions, each of the guard buried regions and the guard diffusion region connected thereto form a guard ring region, and a width of an upper part of the guard ring region is wider than that of a lower part thereof.

In the semiconductor device according to the invention, each of the base diffusion regions and the base buried region are long and narrow, the base diffusion regions are disposed parallel to one another, and the base buried regions are disposed parallel to one another along a longitudinal direction of each of the base diffusion regions.

In the semiconductor device according to the invention, each of the guard buried regions is formed in a rectangular or square ring shape, adjacent sides of the guard buried regions are disposed parallel to one another, and each of the base buried regions is disposed parallel to the two sides parallel to each other among the four sides of each of the guard buried regions.

In the semiconductor device according to the invention, a distance $W_b$ between an inner circumferential edge of the innermost guard buried region among the guard buried regions and an edge of a longer side of the base buried region opposing parallel to the guard buried region, and the distance $Wm_1$ and $Wm_2$ have a relationship represented by the following expression (g):

$$Wm_1 < W_b < Wm_2 \qquad (g).$$

In the semiconductor device according to the invention, the base buried region is formed long and narrow and a distance $W_a$ between both ends of the base buried region in the longitudinal direction and the innermost guard buried region is substantially half the distance $W_b$ between the inner circumferential edge of the innermost guard buried region among the guard buried regions and the edge of the longer side of the base buried region opposing parallel to the guard buried region.

In the semiconductor device according to the invention, the base buried region is long and narrow and both ends of the base buried region in the longitudinal direction are connected to the innermost guard buried region.

Each base buried region is equal in width in the semiconductor device of this invention.

Each guard buried region is equal in width in the semiconductor device of this invention.

In the semiconductor device according to the invention, each base buried region is equal in width, each guard buried region is equal in width, and the widths of the base buried region and the guard buried region are equal to each other.

The semiconductor device according to the invention further includes a source electrode film electrically connected to the source diffusion region and the base diffusion region.

The semiconductor device according to the invention further includes a drain layer of the same conductivity type as that of the resistance layer formed on a surface of the resistance layer opposite to the surface where the base region is formed and the drain layer has a higher concentration than the resistance layer.

The semiconductor device according to the invention further includes a collector layer of the conductivity type opposite to that of the resistance layer; and the collector layer is formed on a surface of the resistance layer opposite to the surface where the base region is formed.

The semiconductor device according to the invention further includes a Schottky electrode film which forms a Schottky junction with the resistance layer; and the Schottky electrode film is formed on a surface of the resistance layer opposite to the surface where the base region is formed.

The semiconductor device according to the invention further includes a drain electrode film formed on a surface of the resistance layer where the base diffusion region is formed and the drain electrode film is electrically connected to the resistance layer and insulated from the source electrode film.

As in the foregoing, according to the present invention, the source diffusion region can be disposed with a prescribed distance apart from the edge of the base diffusion region along the edge of the base diffusion region. In this way, the source electrode film connected to the source diffusion region can be electrically connected with the base diffusion region in the vicinity of the widthwise center of the base diffusion region.

According to the present invention, avalanche breakdown does not occur in the withstand voltage region; and therefore, avalanche current does not concentrate in the base diffusion region adjacent to the innermost guard region, and high withstand strength against destruction can be obtained.

Setting the conditions defined in accordance with claims 1 or 3, avalanche current does not pass through the high resistance part of the base diffusion region under the bottom of the source diffusion region, and therefore even higher withstand strength against destruction can be obtained.

When the base diffusion regions and the base buried region are long and narrow, the base buried regions are disposed parallel in the longitudinal direction of the base diffusion region.

A semiconductor device having high withstand voltage and high withstand strength against destruction can be obtained.

BRIEF DESCRIPTION OF THE DRAWINGS

FIG. 27 is a sectional view of an active region part in a semiconductor device according to a first embodiment of the invention;

DETAILED DESCRIPTION OF THE INVENTION

Figure 1A:
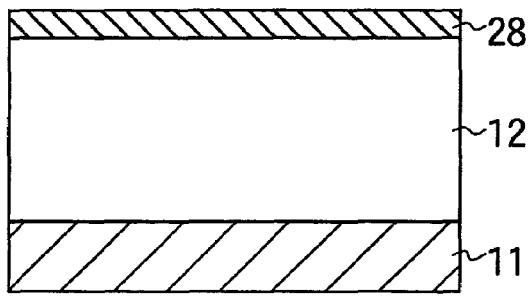
FIGS. 1(*a*) and 1(*b*) are views for illustrating a process of manufacturing a semiconductor device according to the invention (1)

According to the invention, among P type and N type, one is referred to as the first conductivity type and the other as the second conductivity type. When the first conductivity type is N-type, the second conductivity is P-type; and conversely, when the first conductivity type is P-type, the second conductivity type is N-type.

In the following description of embodiments, the semiconductor substrate or the semiconductor layer is made of single crystal of silicon, while the material may be crystal of other semiconductor materials.

The structure of a semiconductor device according to the invention will be described. The reference numeral 1 in FIGS. 27 and 28 denotes a semiconductor device according to a first embodiment of the invention.

A growth layer 12 of a first conductivity type is epitaxially grown on the surface of a wafer type semiconductor support layer 11 of the first conductivity type. A plurality of such semiconductor devices according to the invention are produced in a single wafer; and hereinafter, the internal structure of a single semiconductor device among them will be described with reference to the drawings.

A conductive layer 14 of the first conductivity type having a concentration higher than that of the growth layer 12 is formed at the inside surface of the growth layer 12 and in the center of the semiconductor device 1. The growth layer 12 and the conductive layer 14 form a resistance layer 15 that serves as the drain of a MOS transistor. Semiconductor devices without the conductive layer 14 are covered by the invention, and in this case, the resistance layer 15 is formed by the growth layer 12.

The semiconductor device 1 according to the invention has a plurality of guard buried regions 44b of the second conductivity type. The guard buried regions 44b are each in a ring shape and concentrically disposed.

A plurality of base diffusion regions 17a of the second conductivity type are formed at prescribed intervals at the inner side of the innermost guard buried region 44b and in the vicinity of the inside surface of the resistance layer 15. All the base diffusion regions 17a are equal in depth, and shallower than the depth of the conductive layer 14 in this example. It should be noted however that semiconductor devices having a conductive layer 14 with a depth shallower than the base diffusion regions 17a are also covered by the invention.

In the vicinity of the inside surface of each of the base diffusion regions 17a, a source diffusion region 21 of the first conductivity type and an Ohmic diffusion region 20 of the second conductivity type having a surface concentration higher than that of the base diffusion region 17a are disposed.

The base diffusion region 17a, the source diffusion region 21, and the Ohmic diffusion region 20 all have a long and narrow two-dimensional shape (such as, a rectangle). Inside each single base diffusion region 17a, there are one or two source diffusion regions 21, the longer side of which is provided along the longitudinal direction of the base diffusion region 17a.

The Ohmic diffusion region 20 is provided in the widthwise center of each of the base diffusion regions 17a and has its longer side provided along the longitudinal direction of the base diffusion region 17a.

The widths and lengths of the source diffusion region 21 and the Ohmic diffusion region 20 are smaller than those of the base diffusion region 17a, and the source diffusion region 21 and the Ohmic diffusion region 20 are shallower than the base diffusion region 17a. The source diffusion region 21 and the Ohmic diffusion region 20 are provided so that they do not extend from the base diffusion region 17a.

The source diffusion region 21 and the base diffusion region 17a are of the opposite conductivity types; and therefore, a PN junction forms between the source diffusion region 21 and the base diffusion region 17a. Meanwhile, the Ohmic diffusion region 20 and the base diffusion region 17a are of the same conductivity type and therefore electrically connected with each other.

The source diffusion region 21 is provided a prescribed distance apart from the longer side of the base diffusion region 17a, and inside the base diffusion region 17a, the part between the longer side of the base diffusion region 17a and the longer side of the source diffusion region 21 is formed as a channel region 22 in which an inversion layer that will be described is formed. The base diffusion region 17a and the source diffusion region 21 are long and narrow; and therefore, the channel region 22 is also long and narrow.

A gate insulating film 34 is provided on the channel region 22. The gate insulating film 34 extends slightly off the channel region 22 on both sides thereof in the widthwise direction; and therefore, the widthwise ends of the gate insulating film 34 are positioned on the source diffusion region 21 and the resistance layer 15.

A gate electrode film 36 is provided on the surface of the gate insulating film 34, and an interlayer insulating film 37 is provided on the gate electrode film 36.

A source electrode film 38 is provided on the interlayer insulating film 37. The surfaces of the source diffusion region 21 and the Ohmic diffusion region 20 are at least partly exposed; and the source electrode film 38 is also provided at the exposed part and electrically connected to the source diffusion region 21 and the Ohmic diffusion region 20.

Accordingly, the base diffusion region 17a is connected to the source electrode film 38 through the Ohmic diffusion region 20. Therefore, the source diffusion region 21 and the base diffusion region 17a are short-circuited by the source electrode film 38. The interlayer insulating film 37 positioned between the source electrode film 38 and the gate electrode film 36 so that the source electrode film 38 and the gate electrode film 36 are insulated from each other by the interlayer insulating film 37.

A drain electrode film 30 is provided on the surface of the semiconductor support layer 11 opposite to the side that the resistance layer 15 is provided. Unlike a Schottky junction type IGBT that is later described, the drain electrode film 30 and the semiconductor support layer 11 are in Ohmic contact and electrically connected with each other.

The operation of the semiconductor device 1 is hereinafter described. In this case, the first conductivity type is N-type, and the second conductivity type is P-type. When a positive voltage equal to or higher than the threshold voltage is applied to the gate electrode film 36 while the source electrode film 38 is grounded and positive voltage is applied to the drain electrode film 30, an inversion layer of the opposite conductivity type to that of the channel region 22 is formed at the inside surface of the channel region 22. The source diffusion region 21 and the resistance layer 15 are connected by the inversion layer and attain a conduction state.

When the semiconductor device 1 is a MOS transistor, the semiconductor support layer 11 serves as a drain layer, and in a conduction state, current is passed from the drain electrode film 30 toward the source electrode film 38 through the inversion layer, the resistance layer 15, and the drain layer (semiconductor support layer 11).

Once the potential of the gate electrode film 36 is pulled to a level less than the threshold voltage from the conduction state by short-circuiting between the gate electrode film 36 and the source electrode film 38 or the like, the inversion layer disappears, and a cutoff state is attained. In the cutoff state, no current is passed.

Figure 8A:
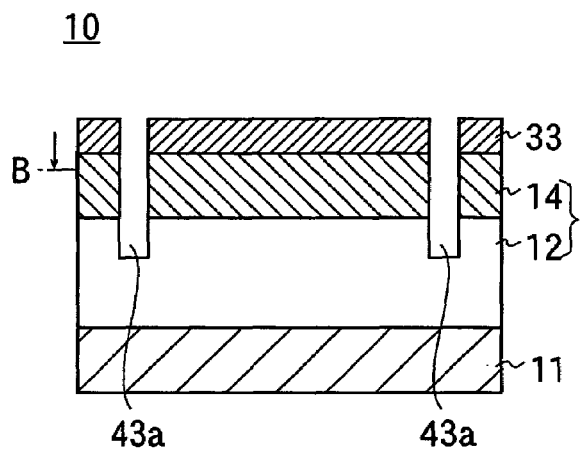
FIGS. 8(a) and 8(b) are views for illustrating the process of manufacturing the semiconductor device according to the invention (8)
Figure 9A:
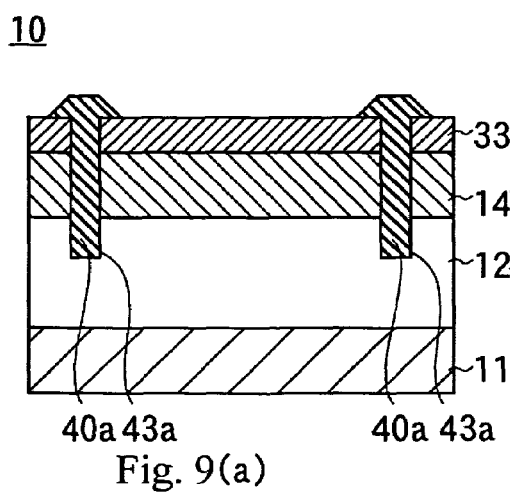
FIGS. 9(a) and 9(b) are views for illustrating the process of manufacturing the semiconductor device according to the invention (9)

As shown in FIG. 8(a) that will be mentioned later, in the semiconductor device 1, the resistance layer 15 has a long and narrow groove 43a (which is formed after a conductive region 14 is formed in the embodiment, while it may be formed before the conductive region 14 is formed). As shown in FIG. 9(a), a semiconductor material 40a of the second conductivity type fills the groove 43a, and the groove 43a and a part of the semiconductor material 40a below the base diffusion region 17a form a base buried region 44a.

As described below, the upper part of the base buried region 44a is connected to the base diffusion region 17a.

A PN junction is formed between the second conductivity type region including the base diffusion region 17a and the base buried region 44a and the first conductivity type region including the resistance layer 15. When the PN junction is reverse biased, a depletion layer expands from the PN junction into the base diffusion region 17a, the resistance layer 15, and the base buried region 44a.

The shape and position of the base buried region 44a will be described. The depth $D_1$ of the groove 43a from the surface of the resistance layer 15 is not large enough to reach the semiconductor support layer 11 and deeper than the depth $D_2$ of the base diffusion region 17a and the depth of the conductive layer 14.

The base diffusion region 17a extends at a longitudinal direction along the longitudinal direction of the groove 43a.

The base diffusion region 17a is formed to have a width across a plurality of grooves 43a; and therefore, at least two base buried regions 44a are provided at the bottom of each of the base diffusion regions 17a. The same number of base buried regions 44a is provided at the bottom of each of the base diffusion regions 17a.

The base diffusion regions 17a are parallel to one another, and a plurality of base buried regions 44a positioned at the bottom of one base diffusion region 17a are parallel to the longer side of the base diffusion region 17a to which their upper parts are connected. Therefore, the base buried regions 44a are parallel to one another. The base buried regions 44a are equal in width.

The connection part between the base buried regions 44a and the base diffusion region 17a is positioned more on the inner side of the base diffusion region 17a than the channel region 22, so that the base buried region 44a does not exist immediately under the channel region 22.

The distance between the base buried regions 44a, the distance between the base buried region 44a and the guard buried region 44b, and the distance between the guard buried regions 44b are defined as the width of the resistance layer 15 interposed between opposing two base buried regions 44a, the width of the resistance layer 15 interposed between the base buried region 44a and the guard buried region 44b opposing each other or between opposing guard buried regions 44b. Then, if three or more base buried regions 44a are positioned under the bottom of the same base diffusion region 17a, the distance $Wm_1$ between the base buried regions 44a under the bottom of the same base diffusion region 17a is equal (if at least three base buried regions 44a are positioned under the bottom of one base diffusion region 17a).

Among different base diffusion regions 17a, the distance $Wm_1$ between the base buried regions 44a under the bottom of the same base diffusion region 17a is equal. The distance $Wm_1$ is therefore fixed for all the base diffusion regions 17a.

In FIG. 27, two base buried regions 44a are positioned at the bottom of one base diffusion region 17a, and the distance $Wm_1$ is also the width of the resistance layer 15 between two base buried region 44a positioned at the bottom of the same base diffusion region 17a.

When two adjacent base diffusion regions 17a are as a pair, the distance $Wm_2$ between the base buried regions 44a positioned at the bottoms of different base diffusion regions 17a and opposing each other is fixed among each pair of base diffusion regions 17a.

Meanwhile, the distance $Wm_1$ between the base buried regions 44a under the bottom of the same base diffusion region 17a and the distance $Wm_2$ between the base buried regions 44a positioned at the bottoms of different base diffusion regions 17a and opposing each other are not always equal.

The innermost guard buried region 44b faces the base buried region 44a positioned at either side thereof.

Each of the guard buried regions 44b is in a square ring shape, and the sides of adjacent guard buried regions 44b are parallel to one another and disposed at equal intervals of a distance $W_{PE}$.

Among the guard buried regions 44b, the innermost guard buried region 44b has one side facing parallel to the longer side of the base buried region 44a. The distance between the longer side of the base buried region 44a and the innermost guard buried region 44b that faces the longer side is $W_b$, and each of the base buried regions 44a and each of the guard buried regions 44b are formed to have the same width Wt.

When H represents the distance from the depth $D_2$ of the base diffusion region 17a to the depth $D_1$ of the bottom of the base buried region 44a, i.e. the height $D_1$-$D_2$ of the base buried region 44a (the H denotes a region deeper than the depth of the base diffusion region 17a and shallower than the bottom of the base buried region 44a), L represents the length of the base buried region 44a, n represents the number of base buried regions 44a positioned at the bottom of one base diffusion region 17a, $N_1$ represents the average concentration of the impurity of the first conductivity type in the resistance layer 15 between the upper part (bottom surface of the base diffusion region 17a) and the bottom surface of the base buried region 44a, and $N_2$ represents the concentration of the impurity of the second conductivity type in the base buried region 44a in the region where a conductive region is formed.

The reference character S in FIG. 27 denotes a region representing a single cell area, which corresponds to the area between the widthwise center of one base diffusion region 17a and the widthwise center of the other base diffusion region 17a among a pair of adjacent base diffusion regions 17a. The quantity $q_1$ of the impurity of the first conductivity type and the quantity $q_2$ of the impurity of the second conductivity type contained within the region H deeper than the depth of the base diffusion region 17a and shallower than the bottom surface of the base buried region 44a in one cell area S are represented by the following expressions (1) and (2):

$$q_1 = \{Wm_1 \times (n-1) + Wm_2\} \times N_1 \times H \times L \tag{1}$$

$$q_2 = Wt \times n \times H \times L \times N_2 \tag{2}$$

RESURF condition of which the quantity of the impurity of the first conductivity type and the quantity of the impurity of the second conductivity type are equal is $q_1 = q_2$.

When the base diffusion region 17a and the resistance layer 15 are reversely biased and the part of the resistance layer 15 between base buried regions 44a is filled with a depletion layer, the inside of the base buried regions 44a is also filled with the depletion layer (provided that the electric field of the PN junction between the base buried region 44a and the resistance layer 15 does not attain a critical value for occurring avalanche breakdown before the resistance layer 15 and the base buried region 44a are filled with the depletion layer).

When the reverse bias is greater than the above-mentioned reverse bias, the depletion layer expands toward the semiconductor support layer 11, and avalanche breakdown occurs when the magnitude of the reverse bias is larger than the withstand voltage.

Figure 36:
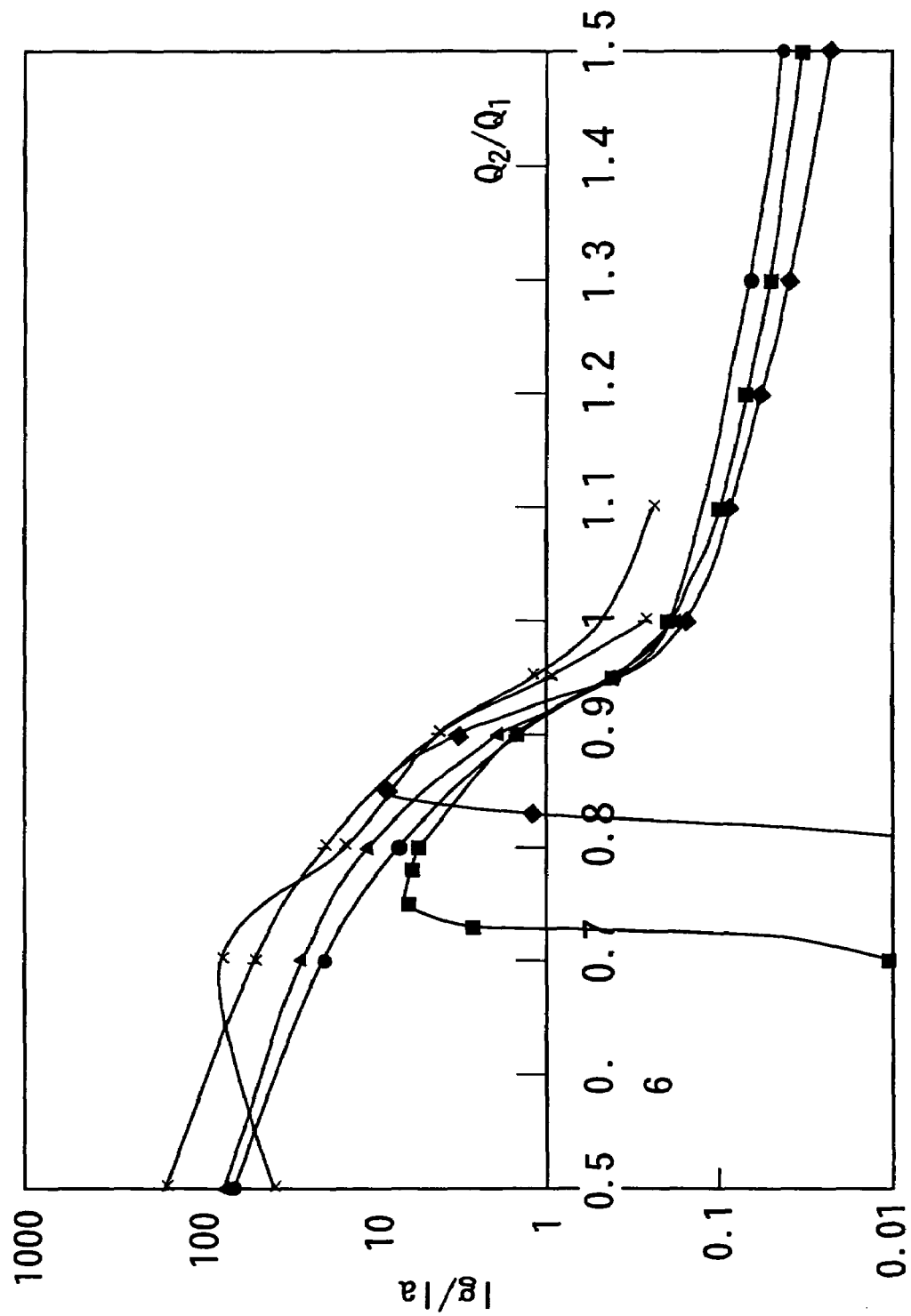
FIG. 36 is a graph for illustrating the position where avalanche breakdown occurs.

$Q_1$ represents the quantity of the impurity of the first conductivity type and $Q_2$ represents the quantity of the impurity of the second conductivity type included in the part inside the widthwise center of the innermost guard buried region 44b, deeper than the bottom of the base diffusion region 17a, and shallower than the bottom surfaces of the base buried region 44a and the guard buried region 44b. FIG. 36 is then a graph for illustrating the relationship between the ratio $Q_2/Q_1$ of the impurity quantities $Q_2$ and $Q_1$ and the position where avalanche breakdown occurs, when the following Expression (a) is satisfied:

$$Wm_1 < W_{PE} < Wm_2 \tag{a}$$

In the graph, the ordinate represents the ratio Ig/Ia of current Ia flows through an active region inside the innermost guard region 44b and current Ig flows through a withstand voltage region outside the active region, and the abscissa represents the ratio $Q_2/Q_1$ of the quantities of impurities $Q_2$ and $Q_1$.

The position of avalanche breakdown can be determined based on the value of Ig/Ia.

More specifically, if avalanche breakdown occurs in the withstand voltage region, the current Ig that flows through the withstand voltage region becomes larger than the current Ia that flows through the active region; and therefore, the value Ig/Ia is greater than 1.

When avalanche breakdown occurs in the active region, the current Ia that flows through the active region becomes larger than the current Ig that flows through the withstand voltage region; and therefore, the value Ig/Ia is smaller than 1.

The condition obtained by calculating the graph shown in FIG. 36 is as shown in Table 1.

TABLE 1

Dots and calculation condition

| | $Wm_2$ | $Wm_1$ | $W_b$ | $W_{PE}$ | Q |
|---|---|---|---|---|---|
| ◆ | 5.0 | 1.4 | 4.1 | 3.2 | 2.0 |
| ■ | 5.0 | 1.4 | 4.1 | 3.2 | 1.5 |
| ▲ | 5.0 | 2.0 | 4.25 | 3.5 | 1.5 |
| ✳ | 5.0 | 3.0 | 4.5 | 4.0 | 1.5 |
| ✴ | 6.0 | 2.0 | 5.0 | 4.0 | 1.5 |
| ● | 5.0 | 2.0 | 4.25 | 3.5 | 1.37 |

Unit of width: μm
Unit of impurity quantity Q: $\times 10^{12}$ cm$^{-2}$

As can be understood from FIG. 36, avalanche breakdown occurs in the withstand voltage region when $Q_2/Q_1$ is 0.9 or less, and therefore Ig/Ia is larger than 1. When $Q_2/Q_1$ is larger than 0.9, and Ig/Ia become smaller than 1, avalanche breakdown occurs in the active region.

When $Q_2/Q_1$ is 1 or more in particular, Ig/Ia is smaller than 1 according to the condition in Table 1. In order to set $Q_2/Q_1$ to 1 or more, the total quantity of the impurity of the second conductivity type should be larger than the total quantity of the impurity of the first conductivity type. It can be achieved for example by setting the impurity concentration $N_2$ of the impurity of the second conductivity type in the base buried region 44a and the guard buried region 44b to be appropriate values.

If the RESURF condition is greatly deviated, the withstand voltage decreases so that $Q_1 \leq Q_2 \leq Q_1 \times 2.0$ and $q_1 \leq q_2 \leq q_1 \times 2.0$ hold for the quantities $Q_2$ and $q_2$ of the second conductivity type impurity.

In the above description, two base buried regions 44a are provided under the bottom of each of the base diffusion regions 17a, but three or more base buried regions may be provided. When the quantity of the impurity of the second conductivity type is increased so that the expression (2) is satisfied, the concentration $N_2$ of the second conductivity type impurity may be increased, the width Wt of the base buried region 44a may be increased or the number of base buried regions 44a positioned at the bottom of each of the base diffusion regions 17a may be increased. However, if the width Wt is increased, growth of a semiconductor material 40a at the inside surface of the groove 43a becomes difficult; and therefore, an approach for increasing the number of base buried regions 44a is preferable.

As the distances $Wm_1$, $Wm_2$, and $W_{PE}$, depths $D_1$ and $D_2$ and other values were fixed to values shown in below mentioned Table 2 while the concentrations of the growth layer 12, the base buried region 44a and the guard buried region 44b were varied in calculation to cause the ratio of concentrations $Q_1$ and $Q_2$ to vary. In this way, the positions where avalanche breakdown occur were examined.

TABLE 2

Calculation condition

| Distance $Wm_1$ | 2.0 μm |
|---|---|
| Distance $Wm_2$ | 5.0 μm |
| Distance $W_b$ | 4.25 μm |
| Distance $W_{PE}$ | 3.5 μm |
| Width Wt | 1.4 μm |
| Buried region depth $D_1$ | 17 μm |
| Growth layer impurity concentration | Variable |
| Buried region impurity concentration | Variable |
| Base diffusion region surface concentration | $3.0 \times 10^{18}$ cm$^{-3}$ |
| Base diffusion region depth $D_2$ | 1.0 μm |

$Wm_1 < W_{PE} < Wm_2$

The result is shown in Table 3.

TABLE 3

Relationship between concentration and breakdown position

| $Q_2/Q_1$ | Growth layer concentration (cm$^{-3}$) | Concentration of semiconductor material in groove (cm$^{-3}$) | Breakdown position | Breakdown voltage (V) |
|---|---|---|---|---|
| 2.00 | $1.37 \times 10^{15}$ | $6.86 \times 10^{15}$ | Active region | 327 |
| 1.43 | $1.92 \times 10^{15}$ | $6.86 \times 10^{15}$ | Active region | 382 |
| 1.25 | $2.19 \times 10^{15}$ | $6.86 \times 10^{15}$ | Active region | 399 |
| 1.11 | $2.47 \times 10^{15}$ | $6.86 \times 10^{15}$ | Active region | 408 |
| 1.00 | $2.74 \times 10^{15}$ | $6.86 \times 10^{15}$ | Active region | 405 |
| 0.90 | $2.74 \times 10^{15}$ | $6.18 \times 10^{15}$ | Withstand voltage region | 393 |
| 0.80 | $2.74 \times 10^{15}$ | $5.94 \times 10^{15}$ | Withstand voltage region | 366 |
| 0.70 | $2.74 \times 10^{15}$ | $4.80 \times 10^{15}$ | Withstand voltage region | 329 |
| 0.50 | $2.74 \times 10^{15}$ | $3.43 \times 10^{15}$ | Withstand voltage region | 252 |

Under the condition in Table 2, the following expression (a) is established:

$$Wm_1 < W_{PE} < Wm_2 \qquad (a).$$

In this case, when $Q_2/Q_1$ is 0.9 or less, avalanche breakdown occurs in the withstand voltage region. Therefore, when $Q_2/Q_1$ is more than 0.9, particularly 1 or more, avalanche breakdown occurs in the active region.

Next, the distances $Wm_1$, $Wm_2$, and $W_{PE}$, depths $D_1$ and $D_2$ and other values were fixed to values in Tables 4 and 6 different from those in Table 2, and the concentrations of the growth layer 12, the base buried region 44a and the guard buried region 44b were varied in calculation to cause the ratio of the impurity quantities $Q_2$ and $Q_1$ to be varied. In this way, the positions where avalanche breakdown occur were examined.

The result corresponding to Table 4 is shown in Table 5, and the result corresponding to Table 6 is shown in Table 7.

TABLE 4

Calculation condition

| Distance $Wm_1$ | 2.0 μm |
|---|---|
| Distance $Wm_2$ | 5.0 μm |
| Distance $W_b$ | 4.5 μm |
| Distance $W_{PE}$ | 1.4 μm |
| Width Wt | 1.4 μm |
| Buried region depth $D_1$ | 17 μm |

TABLE 4-continued

Calculation condition

| | |
|---|---|
| Growth layer impurity concentration | Variable |
| Buried region impurity concentration | Variable |
| Base diffusion region surface concentration | $3.0 \times 10^{18}$ cm$^{-3}$ |
| Base diffusion region depth $D_2$ | 1.0 μm |

$W_{PE} < Wm_1 < Wm_2$

TABLE 5

Relationship between concentration and breakdown position

| $Q_2/Q_1$ | Growth layer concentration (cm$^{-3}$) | Concentration of semiconductor material in groove (cm$^{-3}$) | Breakdown position | Breakdown voltage (V) |
|---|---|---|---|---|
| 1.64 | $1.62 \times 10^{15}$ | $6.86 \times 10^{15}$ | Withstand voltage region | 313 |
| 1.18 | $2.26 \times 10^{15}$ | $6.86 \times 10^{15}$ | Withstand voltage region | 356 |
| 1.03 | $2.58 \times 10^{15}$ | $6.86 \times 10^{15}$ | Withstand voltage region | 378 |
| 0.92 | $2.91 \times 10^{15}$ | $6.86 \times 10^{15}$ | Withstand voltage region | 398 |
| 0.83 | $3.23 \times 10^{15}$ | $6.86 \times 10^{15}$ | Active region | 394 |
| 0.75 | $3.23 \times 10^{15}$ | $6.18 \times 10^{15}$ | Active region | 371 |
| 0.66 | $3.23 \times 10^{15}$ | $5.94 \times 10^{15}$ | Active region | 327 |
| 0.58 | $3.23 \times 10^{15}$ | $4.80 \times 10^{15}$ | Active region | 284 |
| 0.41 | $3.23 \times 10^{15}$ | $3.43 \times 10^{15}$ | Active region | 214 |

TABLE 6

Calculation condition

| | |
|---|---|
| Distance $Wm_1$ | 4.0 μm |
| Distance $Wm_2$ | 5.0 μm |
| Distance $W_b$ | 4.5 μm |
| Distance $W_{PE}$ | 6.0 μm |
| Width Wt | 1.4 μm |
| Buried region depth $D_1$ | 17 μm |
| Growth layer impurity concentration | Variable |
| Buried region impurity concentration | Variable |
| Base diffusion region surface concentration | $3.0 \times 10^{18}$ cm$^{-3}$ |
| Base diffusion region depth $D_2$ | 1.0 μm |

$Wm_1 < Wm_2 < W_{PE}$

TABLE 7

Relationship between concentration and breakdown position

| $Q_2/Q_1$ | Growth layer concentration (cm$^{-3}$) | Concentration of semiconductor material in groove (cm$^{-3}$) | Breakdown position | Breakdown voltage (V) |
|---|---|---|---|---|
| 2.22 | $9.90 \times 10^{15}$ | $6.86 \times 10^{15}$ | Active region | 369 |
| 1.56 | $1.39 \times 10^{15}$ | $6.86 \times 10^{15}$ | Active region | 411 |
| 1.39 | $1.58 \times 10^{15}$ | $6.86 \times 10^{15}$ | Active region | 423 |
| 1.22 | $1.78 \times 10^{15}$ | $6.86 \times 10^{15}$ | Active region | 427 |
| 1.10 | $1.98 \times 10^{15}$ | $6.86 \times 10^{15}$ | Withstand voltage region | 414 |
| 0.99 | $1.98 \times 10^{15}$ | $6.18 \times 10^{15}$ | Withstand voltage region | 379 |
| 0.88 | $1.98 \times 10^{15}$ | $5.94 \times 10^{15}$ | Withstand voltage region | 340 |
| 0.77 | $1.98 \times 10^{15}$ | $4.80 \times 10^{15}$ | Withstand voltage region | 301 |
| 0.55 | $1.98 \times 10^{15}$ | $3.43 \times 10^{15}$ | Withstand voltage region | 232 |

Under the condition in Table 4, the following expression (c) is established:

$$W_{PE} < Wm_1 < Wm_2 \quad (c).$$

In this case, when $Q_2/Q_1$ is 0.92 or more, avalanche breakdown occurs in the withstand voltage region. Therefore, when $Q_2/Q_1$ is less than 0.92, particularly 0.83 or less, avalanche breakdown occurs in the active region.

Under the condition in Table 6, the following expression (e) is established:

$$Wm_1 < Wm_2 < W_{PE} \quad (e).$$

In this case, when $Q_2/Q_1$ is 1.10 or less, avalanche breakdown occurs in the withstand voltage region. Therefore, when $Q_2/Q_1$ is more than 1.10, particularly 1.22 or more, avalanche breakdown occurs in the active region.

In the semiconductor device 1 according the invention, the base buried region 44a is long and narrow, and the distance $W_a$ between either end of the base buried region 44a in the longitudinal direction and the innermost guard buried region 44b (which is equal to the width of the growth layer 12 between either end of the base buried region 44a in the longitudinal direction and the innermost guard buried region 44b) is set to be substantially half the distance $W_b$ between the inner circumferential edge of the innermost guard buried region 44b and the edge of the longer side of the base buried region 44a opposing parallel to the guard buried region 44b.

If the depletion layer expands from the longer side of the base buried region 44a toward the innermost guard buried region 44b, not from both ends of the base buried region 44a toward the innermost guard buried region 44b, when the growth layer 12 between the base buried region 44a and the innermost guard buried region 44b is filled with a depletion layer, a depletion layer expands for half of the distance $W_b$ each from the longer side of the base buried region 44a and the inner circumferential surface of the innermost guard buried region 44b, and the depletion layers come into contact with each other.

In this case, the depletion layer expands only for half the distance $W_b$ from the guard buried region 44b between either end of the base buried region 44a and the innermost guard buried region 44b. Therefore, if the distance between either end of the base buried region 44a and the inner circumferential edge of the innermost guard buried region 44b is set to substantially half the distance Wb, the area between both ends of the base buried region 44a and the innermost guard buried region 44b is also filled with a depletion layer.

A method of manufacturing a semiconductor device according to the invention will now be described.

FIGS. 1(a), 2(a) to 26(a) are sectional views each showing the process of forming an active region, and FIGS. 1(b), 2(b) to 26(b) are sectional views each showing a part near the outer periphery of the active region and a withstand voltage region surrounding the active region.

Figure 1B:
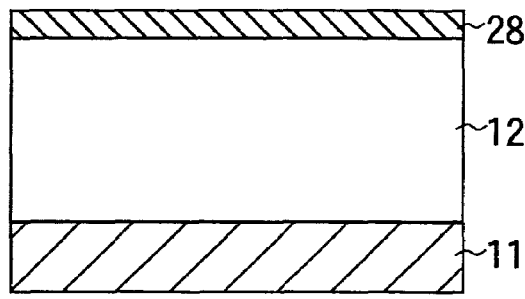

The reference numeral 10 in FIGS. 1(a) and 1(b) shows a processed substrate for manufacturing the semiconductor device according to the invention thereon.

The processed substrate 10 has a semiconductor support layer 11 made of a semiconductor single crystal of a first conductivity type, and a growth layer 12 made of a semiconductor crystal of the same conductivity type as that of the semiconductor support layer 11 epitaxially grown on the surface of the semiconductor support layer 11.

An initial oxide film 28 made of oxide of the semiconductor single crystal is formed on the surface of the growth layer 12 by thermal oxidation treatment.

Figure 2A:
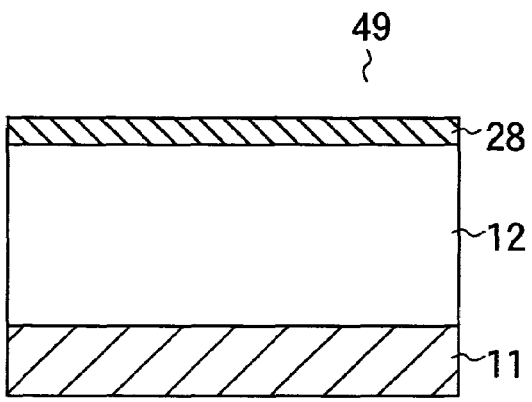
FIGS. 2(a) and 2(b) are views for illustrating the process of manufacturing the semiconductor device according to the invention (2)
Figure 2B:
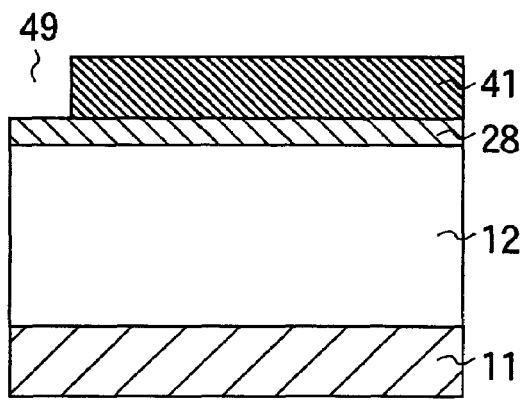

A resist film is formed on the surface of the processed substrate 10 and patterned, so that a square opening 49 is formed on the resist film in a position of the active region as shown in FIGS. 2(a) and 2(b). The reference numeral 41 in FIG. 2(b) denotes the patterned resist film, and the initial oxide film 28 is exposed at the bottom of the opening 49.

Figure 3A:
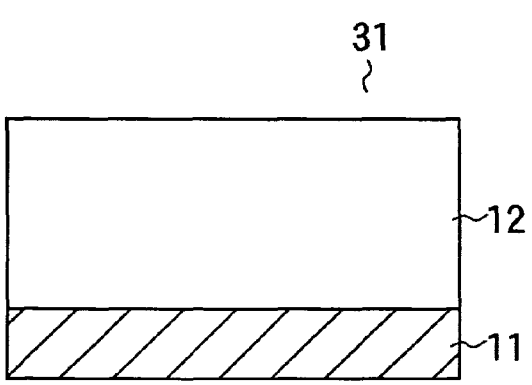
FIGS. 3(a) and 3(b) are views for illustrating the process of manufacturing the semiconductor device according to the invention (3)
Figure 3B:
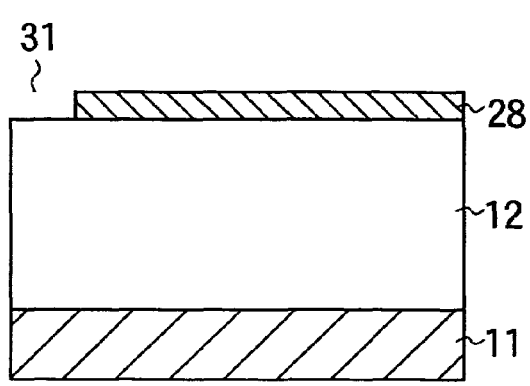

The initial oxide film 28 positioned at the bottom of the opening 49 is etched away, and then as shown in FIGS. 3(a) and 3(b), an opening 31 having the same shape as that of the opening 49 of the resist film 41 is formed at the initial oxide film 28. The surface of the growth layer 12 is exposed at the bottom of the opening 31. In the state shown in FIGS. 3(a) and 3(b), the resist film 41 has been removed.

Figure 4A:
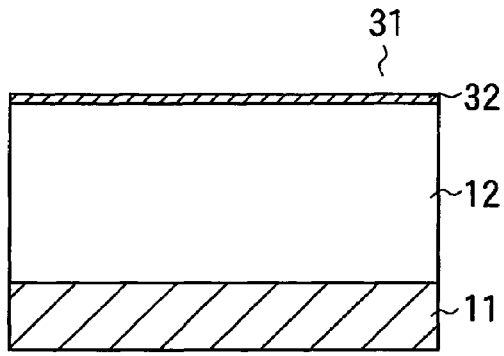
FIGS. 4(a) and 4(b) are views for illustrating the process of manufacturing the semiconductor device according to the invention (4)
Figure 4B:
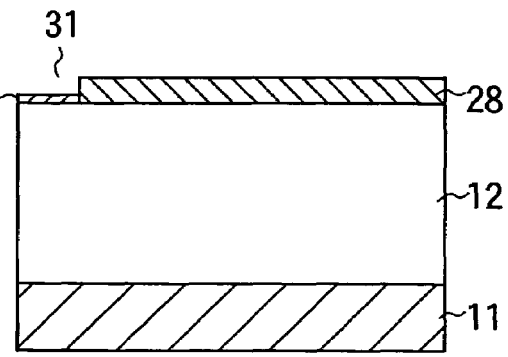

Then, after thermal oxidation treatment, as shown in FIGS. 4(a) and 4(b), a buffer layer 32 made of oxide of the semiconductor forming the growth layer 12 is formed at the bottom of the opening 31. The buffer layer 32 has a thin thickness.

Figure 5A:
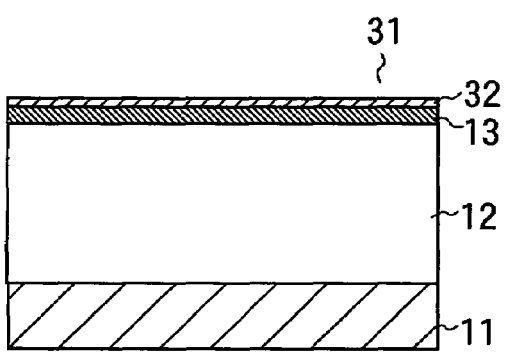
FIGS. 5(a) and 5(b) are views for illustrating the process of manufacturing the semiconductor device according to the invention (5)
Figure 5B:
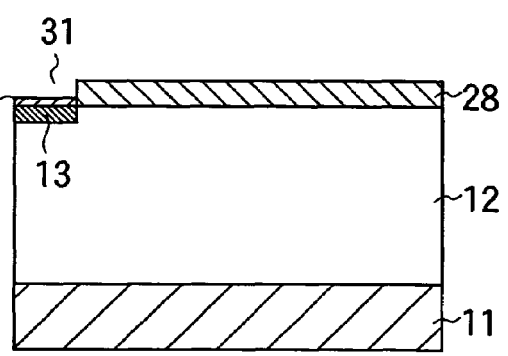

In this state, the processed substrate 10 is irradiated with an impurity of the first conductivity type from its surface, and the impurity is blocked by the initial oxide film 28 and transmitted through the buffer layer 32 so that a high concentration impurity layer 13 of the first conductivity type is formed at the inside surface of the growth layer 12 at the bottom of the opening 31 as shown in FIGS. 5(a) and 5(b). The depth of the high concentration impurity layer 13 is small.

Figure 6A:
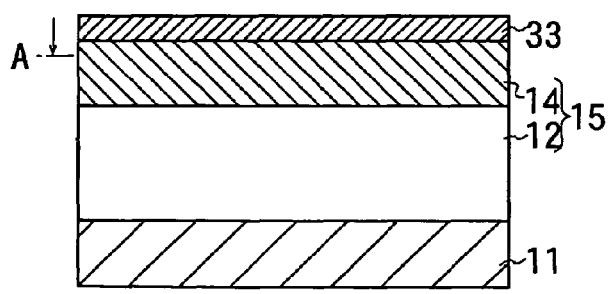
FIGS. 6(a) and 6(b) are views for illustrating the process of manufacturing the semiconductor device according to the invention (6)
Figure 6B:
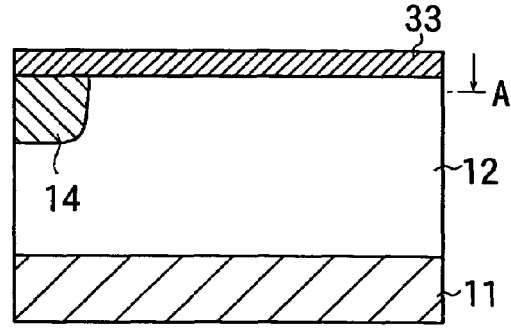

Then, after thermal oxidation treatment, the impurity of the first conductivity type contained in the high concentration impurity layer 13 diffuses in the depth-wise direction and the lateral direction. As shown in FIGS. 6(a) and 6(b), a conductive layer 14 of the first conductivity type is formed in the active region. The conductive layer 14 and the growth layer 12 form a resistance layer 15 of the first conductivity type.

By the thermal oxidation during the diffusion, a semiconductor thermal oxide film is formed on the surface of the processed substrate 10. The reference numeral 33 in FIGS. 6(a) and 6(b) denotes a mask oxide film integrated with the thermal oxide film, the buffer layer 32, and the initial oxide film 28.

The surface concentration of the conductive layer 14 is higher than the concentration of the growth layer 12 about 10 times in magnitude. The conductive layer 14 is formed by the diffusion, and therefore its concentration is high at the surface and is reduced as the depth increases. The conductive layer 14 and the growth layer 12 are of the same conductivity type and do not form a PN junction. Therefore, according to the invention, the depth of the conductive layer 14 is defined in the position where the layer has its concentration reduced to a value twice that of the growth layer 12.

Figure 29:
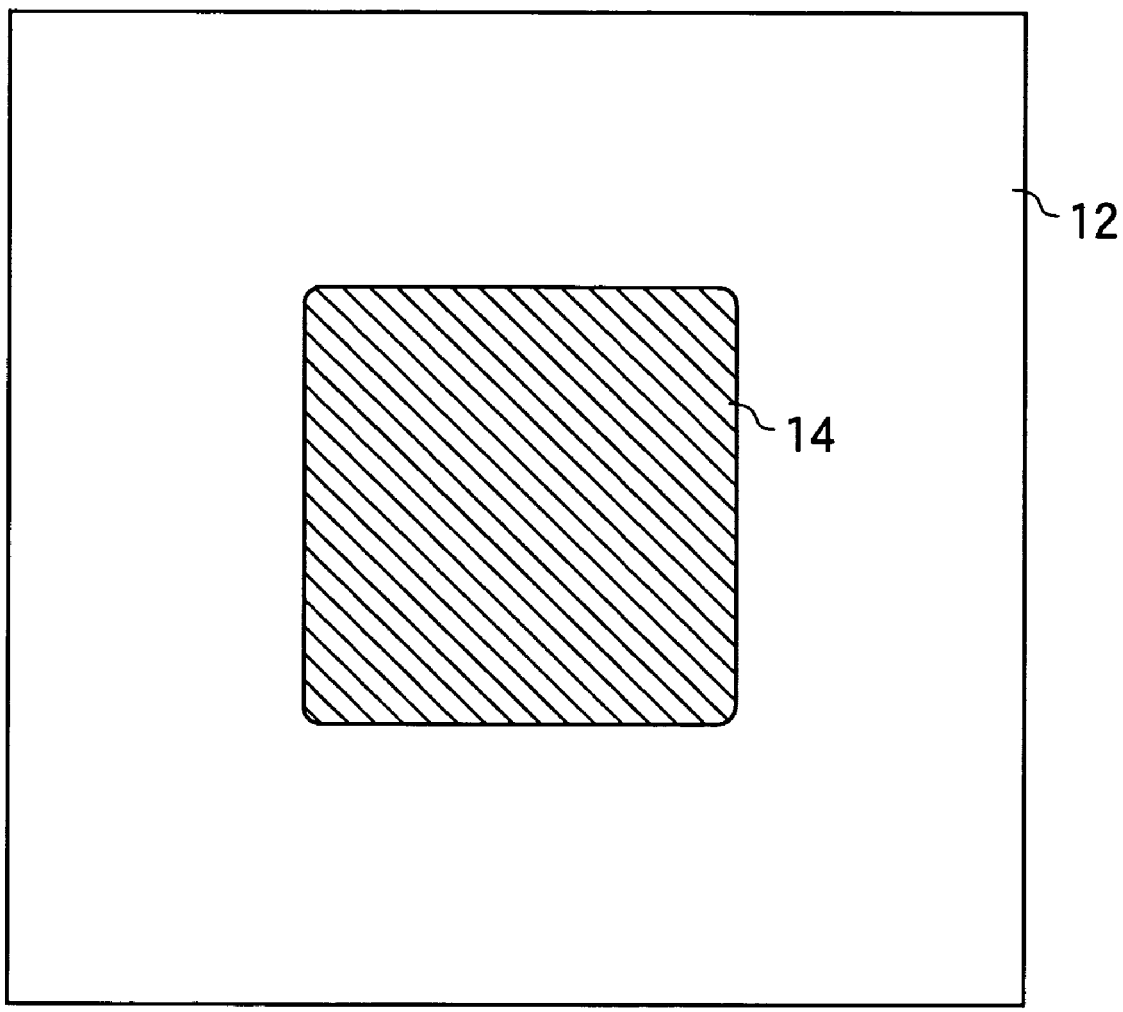
FIG. 29 is a sectional view taken along the line A-A in FIGS. 6(a) and 6(b)

FIG. 29 is a sectional view taken along the line A-A in FIGS. 6(a) and 6(b). By the lateral diffusion of the first conductivity type impurity, the two-dimensional shape of the conductive layer 14 is larger than that of the high concentration impurity layer 13 and in a square having its four corners rounded.

Figure 7A:
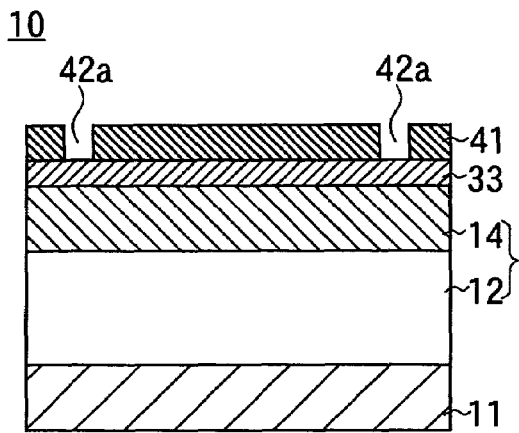
FIGS. 7(a) and 7(b) are views for illustrating the process of manufacturing the semiconductor device according to the invention (7)
Figure 7B:
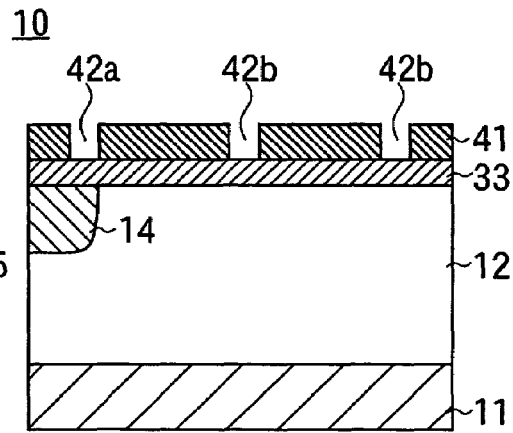

Then, a resist film is formed on the mask oxide film 33 and patterned, and as shown in FIG. 7(a), a plurality of parallel long and narrow openings 42a are formed in the active region. As shown in FIG. 7(b), a plurality of ring-shaped openings 42b are formed in the withstand voltage region. The reference numeral 41 denotes the resist film having the openings 42a and 42b.

The long and narrow openings 42a have a narrow rectangular shape, and the ring-shaped openings 42b have square ring shapes (rectangles or regular squares) in different sizes.

The ring-shaped openings 42b are provided concentrically, and the long and narrow openings 42a are surrounded by the ring-shaped openings 42b.

Opposing sides of adjacent ring-shaped openings 42b are provided parallel to one another, and the four sides of the long and narrow opening 42a are either parallel or orthogonal to the sides of the ring-shaped openings 42b.

The surface of the mask oxide film 33 is exposed at the bottoms of the openings 42a and 42b. The mask oxide film 33 positioned at the bottoms of the openings 42a and 42b is etched away, the mask oxide film 33 is patterned, and then the resist film 41 is removed. Then, using the mask oxide film 33 as a mask, the resistance layer 15 is excavated by etching so that active grooves 43a are formed at the bottoms of the long and narrow openings 42a as shown in FIGS. 8(a) and 8(b), and withstand voltage grooves 43b are formed at the bottoms of the ring-shaped openings 42b.

Figure 8B:
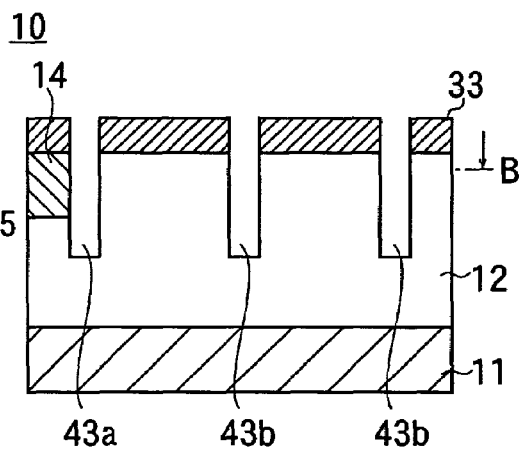
Figure 30:
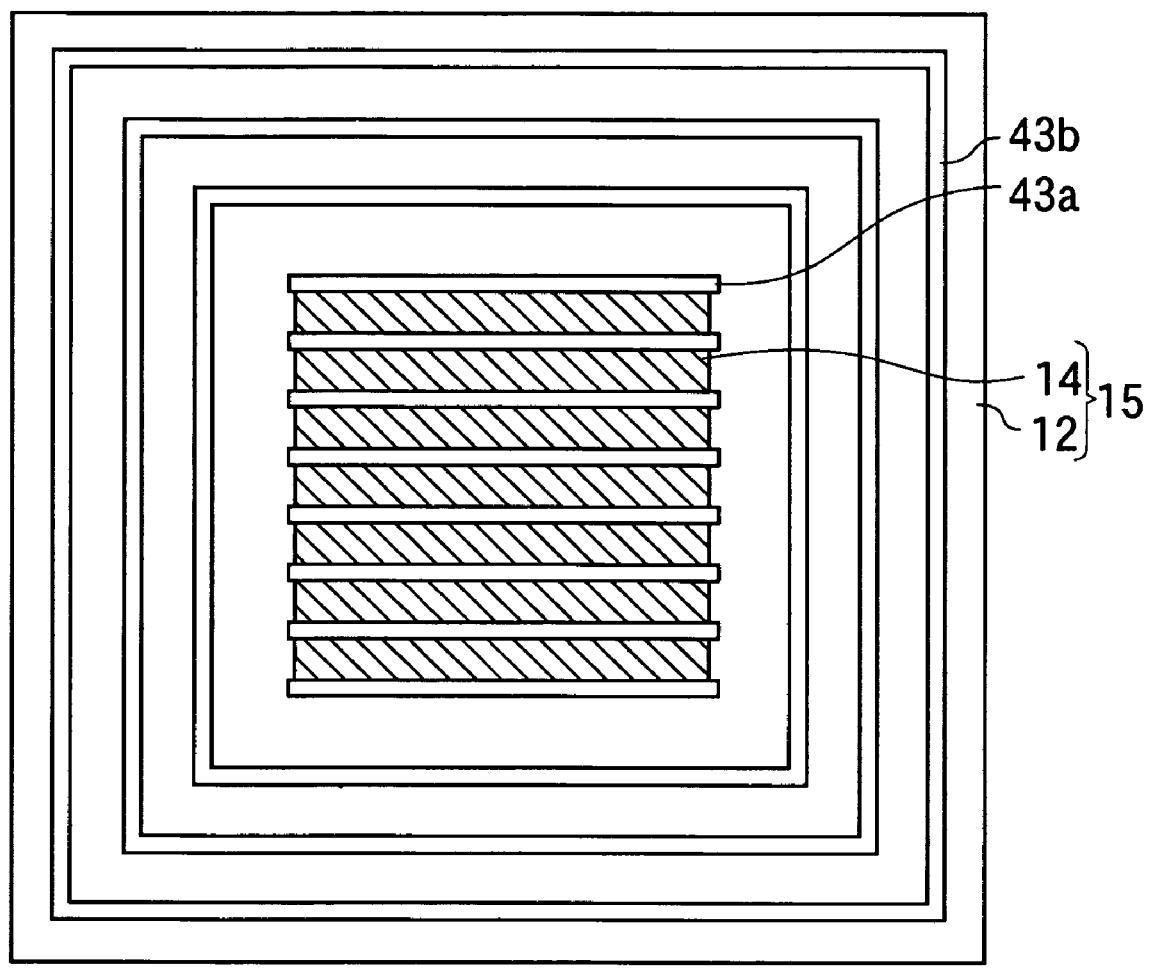
FIG. 30 is a sectional view taken along the line B-B in FIGS. 8(a) and 8(b)

FIG. 30 is a sectional view taken along the line B-B in FIGS. 8(a) and 8(b).

The two-dimensional plan shape of the active groove 43a is a long and narrow rectangular shape, which is the same as the long and narrow opening 42a; and the shape of the withstand voltage groove 43b is a square ring, which is the same as that of the ring-shaped opening 42b.

The distance between the active grooves 43a, the distance between the withstand voltage grooves 43b, and the distance between the active groove 43a and the withstand voltage groove 43b are determined by the distance of the openings 42a and 42b, which satisfies the above expression (a).

The active groove 43a and the withstand voltage groove 43b are formed by the same etching process, and therefore their depths are equal and larger than that of the conductive layer 14 but not large enough to reach the semiconductor support layer 11. Therefore, the growth layer 12 is exposed at the bottoms of the grooves 43a and 43b. The bottoms of the grooves 43a and 43b are parallel to the surface of the growth layer 12, and the side surfaces of the grooves 43a and 43b are orthogonal to the bottom surfaces.

The two-dimensional plan shape of the active groove 43a is a long and narrow rectangle, and the two-dimensional plan shape of the withstand voltage groove 43b is a rectangle or square ring shape.

Figure 9B:
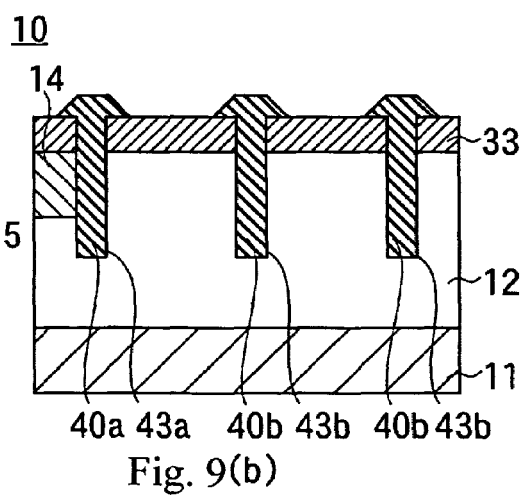

Then, a single crystal or polycrystal semiconductor of the second conductivity type is allowed to grow on the bottom surfaces and the side surfaces inside the grooves 43a and 43b by CVD. As shown in FIGS. 9(a) and 9(b), the grooves 43a and 43b are filled with semiconductor materials 40a and 40b of the second conductivity type made of the grown single crystal or polycrystal semiconductor.

Figure 10A:
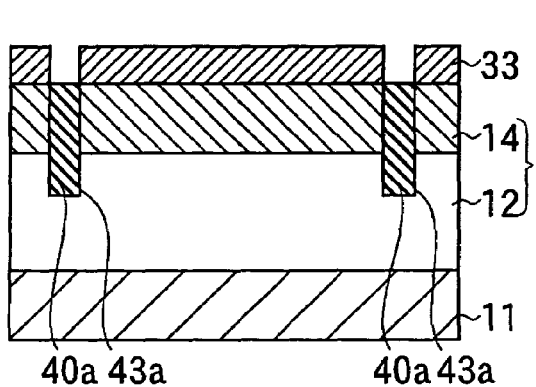
FIGS. 10(a) and 10(b) are views for illustrating the process of manufacturing the semiconductor device according to the invention (10)
Figure 10B:
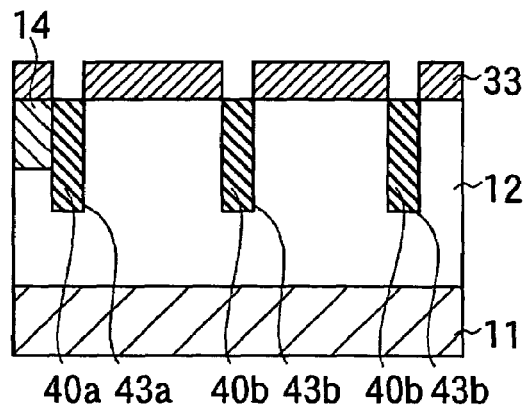
Figure 11A:
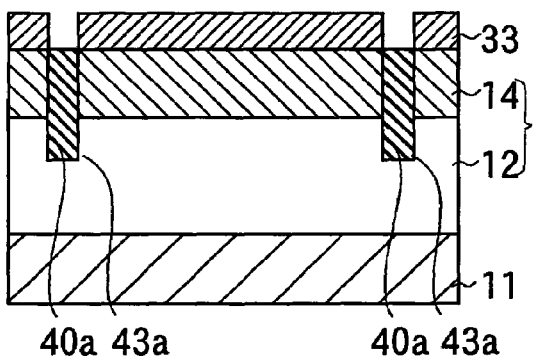
FIGS. 11(a) and 11(b) are views for illustrating the process of manufacturing the semiconductor device according to the invention (11)
Figure 11B:
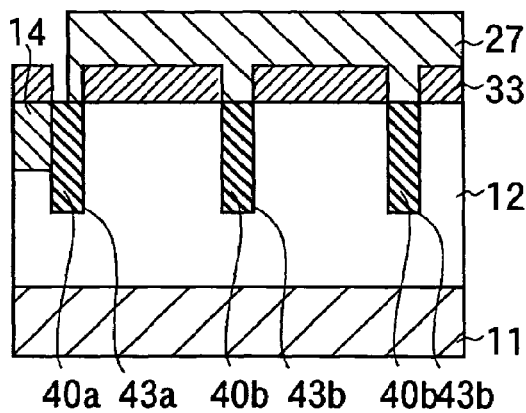

Immediately after the filling process, the upper part of the semiconductor materials 40a and 40b protrude from the surface of the mask oxide film 33, and the part above the resistance layer 15 is etched away as shown in FIGS. 10(a) and 10(b). Then, as shown in FIGS. 11(a) and 11(b), while the surface of the mask oxide film 33 positioned on the conductive layer 14 is kept exposed, a patterned resist film 27 is provided on the mask oxide film 33 that is in close contact with the growth layer 12.

Figure 12A:
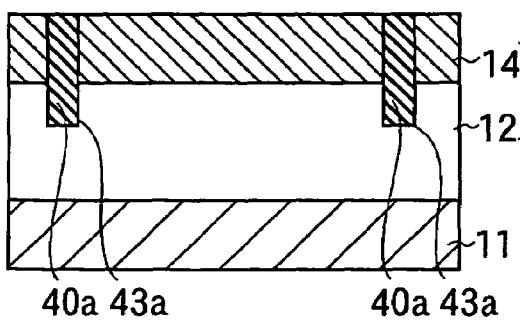
FIGS. 12(a) and 12(b) are views for illustrating the process of manufacturing the semiconductor device according to the invention (12)
Figure 12B:
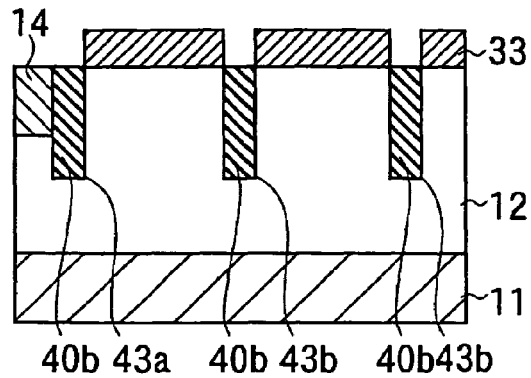

As shown in FIGS. 12(a) and 12(b), etching is carried out, then the mask oxide film 33 in close contact with the growth layer 12 remains and while the surface of the resistance layer 15 in the withstand voltage region (the surface of the growth layer 12) is thus covered, the conductive layer 14 in the active region and the surfaces of the semiconductor materials 40a and 40b in the active region and the withstand voltage region are exposed.

Figure 13A:
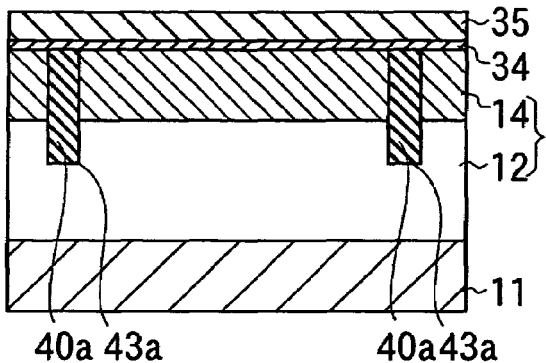
FIGS. 13(a) and 13(b) are views for illustrating the process of manufacturing the semiconductor device according to the invention (13)
Figure 13B:
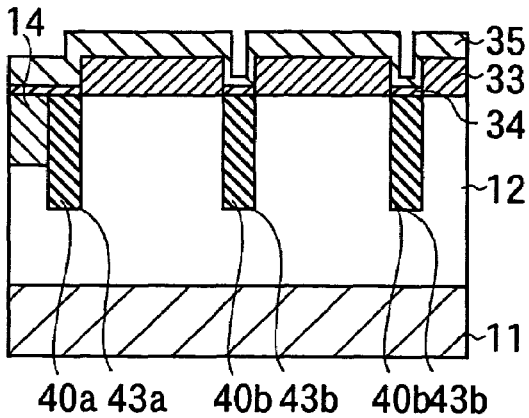

Then, by thermal oxidation treatment, a thin gate insulating film 34 is formed as shown in FIGS. 13(a) and 13(b), and then a polysilicon conductive thin film is deposited on the surface of the gate insulating film 34 by CVD or the like. In this way, a conductive thin film 35 of polysilicon is formed.

Figure 14A:
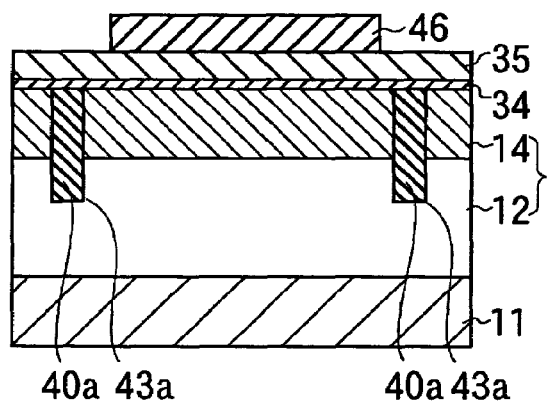
FIGS. 14(a) and 14(b) are views for illustrating the process of manufacturing the semiconductor device according to the invention (14)
Figure 14B:
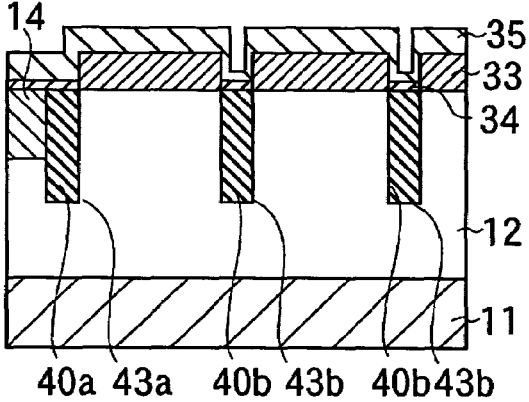
Figure 15A:
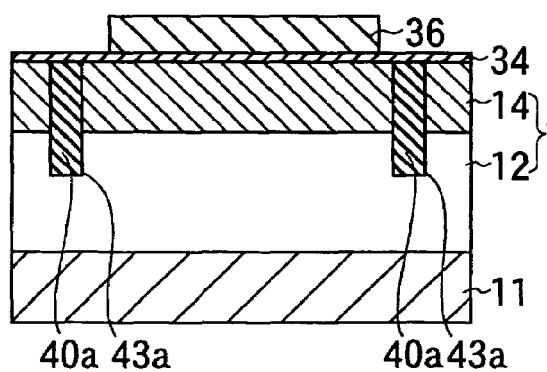
FIGS. 15(a) and 15(b) are views for illustrating the process of manufacturing the semiconductor device according to the invention (15)
Figure 15B:
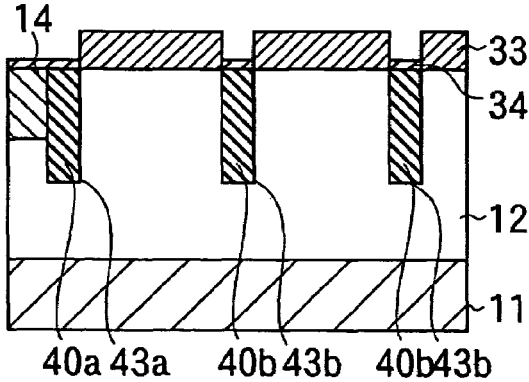

Then, as shown in FIGS. 14(a) and 14(b), a patterned resist film 46 is provided in a prescribed position on the thin conductive film 35. The conductive thin film 35 is patterned by etching, and a gate electrode film 36 is formed as shown in FIGS. 15(a) and 15(b).

Figure 16A:
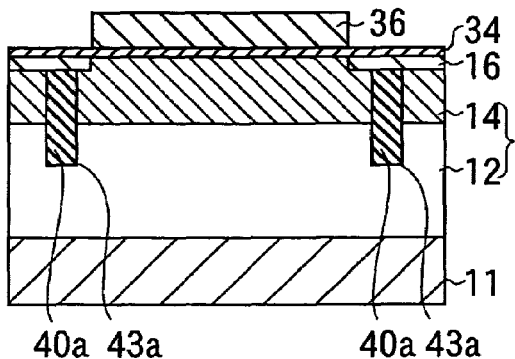
FIGS. 16(a) and 16(b) are views for illustrating the process of manufacturing the semiconductor device according to the invention (16)
Figure 16B:
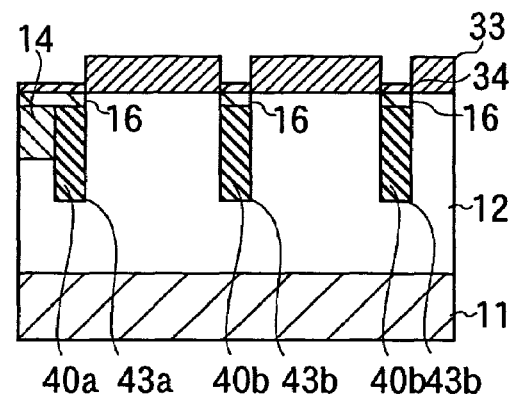

Then, when a second conductivity type impurity is irradiated on the surface of the processed substrate 10, the impurity is transmitted through the exposed gate insulating film 34 with the gate electrode film 36 and the mask oxide film 33 serving as a mask. High concentration impurity region 16 of the second conductivity type is formed inner surface of the conductive layer 14, and the inside surfaces of the semiconductor materials 40a and 40b in the active groove 43a and the withstand voltage groove 43b as shown in FIGS. 16(a) and 16(b).

Figure 17A:
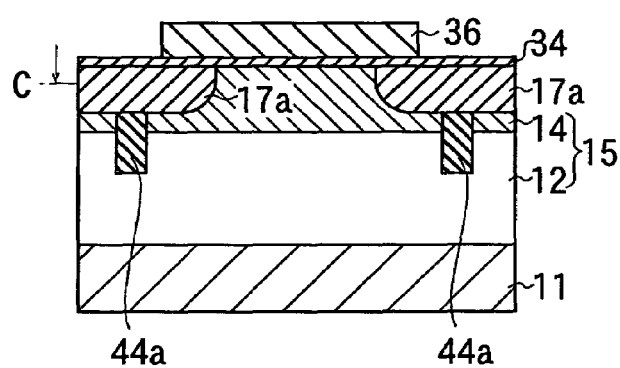
FIGS. 17(a) and 17(b) are views for illustrating the process of manufacturing the semiconductor device according to the invention (17)
Figure 17B:
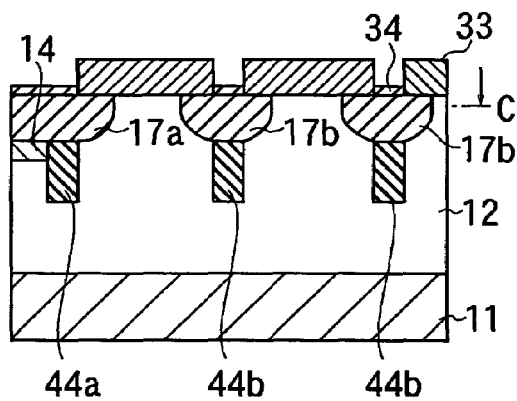

Then, the second conductivity type impurity contained in the high concentration impurity region 16 is diffused by thermal treatment, and a base diffusion region 17a and a guard diffusion region 17b of the second conductivity type are formed in the active region and the withstand voltage region, respectively as shown in FIGS. 17(a) and 17(b).

The high concentration impurity region 16 having the same width as that of the semiconductor material 40b is formed in the upper part of the semiconductor material 40b filled in the withstand voltage groove 43b, and the guard diffusion region 17b has a larger width than that of the guard buried region 44b because of its lateral diffusion.

The base diffusion region 17a and the guard diffusion region 17b are equal in depth and shallower than the conductive layer 14.

Since the concentration of the second conductivity type impurity contained in the base diffusion region 17a and the guard diffusion region 17b is higher than the concentration of the second conductivity type impurity contained in the semiconductor materials 40a and 40b, it is considered that the parts of the semiconductor materials 40a and 40b in a shallower level than the base diffusion region 17a and the guard diffusion region 17b are replaced with the base diffusion region 17a and the guard diffusion region 17b, respectively.

In this case, the remainder (the lower part) of the active groove 43a and the semiconductor material 40a filled therein form a base buried region 44a of the second conductivity type at the bottom of the base diffusion region 17a. The remainder (the lower part) of the withstand voltage groove 43b and the semiconductor material 40b of the second conductivity type filled therein form a guard buried region 44b of the second conductivity type at the bottom of the guard diffusion region 17b.

The guard buried region 44b is composed of the part of the semiconductor material 40b in the withstand voltage groove 43b below the guard diffusion region 17b. The guard diffusion region 17b and the underlying guard buried region 44b form a guard ring region.

However, a semiconductor device 1 without the guard diffusion region 17b is covered by the invention, and in such a case, the guard ring region is formed by the guard buried region 44b.

If the guard ring region does not have the guard diffusion region 17b, the top of the guard buried region 44b is flush with the surface of the growth layer 12. If the upper part of the withstand voltage groove 43b is formed by a groove formed in the insulating film such as the mask oxide film 33 and the semiconductor material 40b is also filled in the groove of the insulating film, the guard buried region 44b is in a higher level than the surface of the growth layer 12.

The base buried regions 44a are long and narrow and parallel to one another. The base buried region 44a is composed of a lower portion that is lower or deeper than the bottom of the base diffusion region 17a and has a lateral rectangular solid shape. The upper part of the base buried region 44a is connected to the base diffusion region 17a and therefore attains a potential for the base buried region 44a to be the same potential as that of the base diffusion region 17a.

Figure 31:
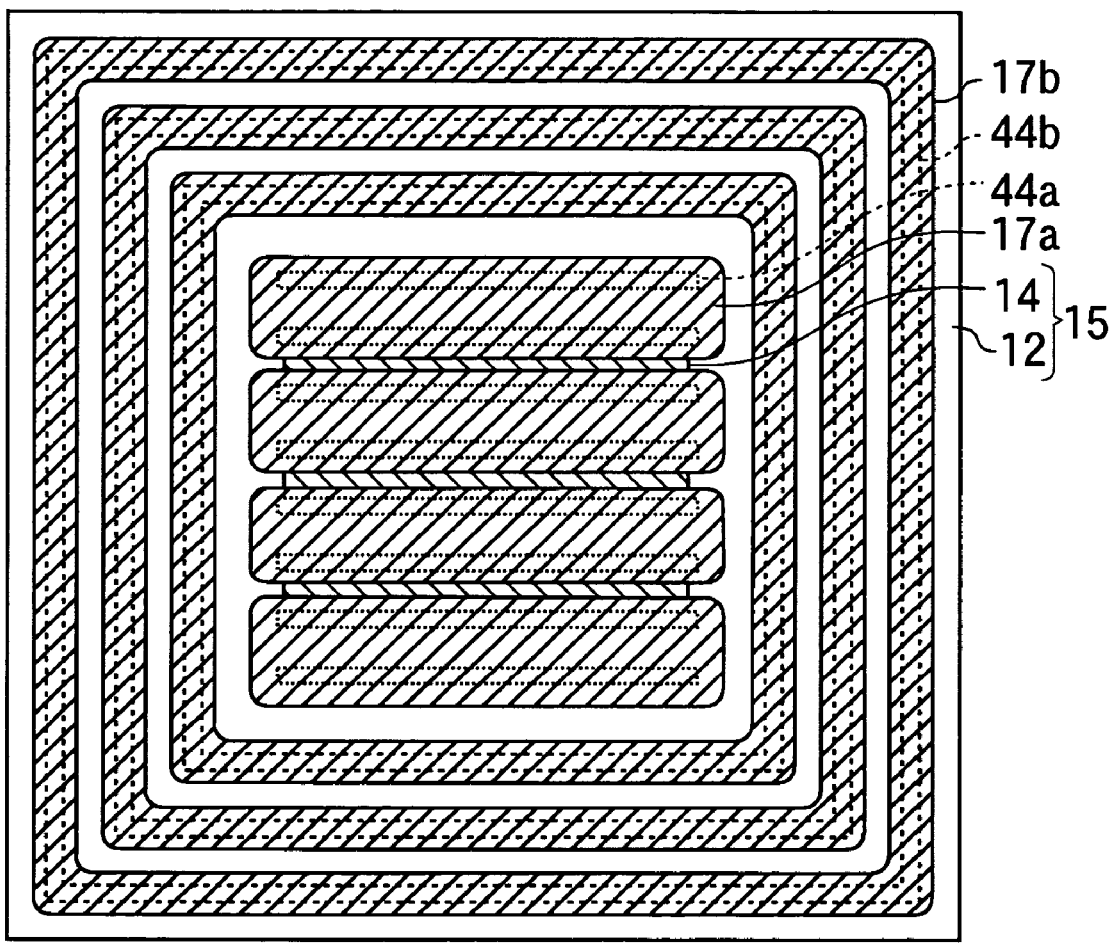
FIG. 31 is a sectional view taken along the line C-C in FIGS. 17(a) and 17(b)

FIG. 31 is a sectional view taken along the line C-C in FIGS. 17(a) and 17(b).

Each of the base diffusion regions 17a has a rectangular shape having its four corners rounded and its longer sides arranged in the extending direction of the base buried region 44a.

The base diffusion regions 17a are provided apart from one another, and the lateral diffusion of the second conductivity type impurity allows the edge of the base diffusion region 17a to come under the bottom of the gate electrode film 36 so that the gate electrode film 36 is provided to span the adjacent base diffusion regions 17a.

The guard diffusion regions 17b have square ring shapes, and are provided concentrically adjacent to one another with a prescribed distance.

Figure 18A:
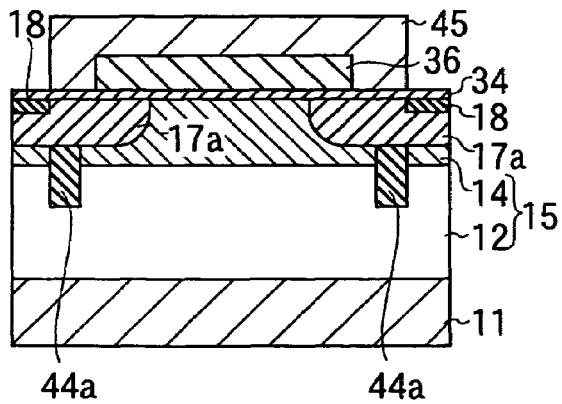
FIGS. 18(a) and 18(b) are views for illustrating the process of manufacturing the semiconductor device according to the invention (18)
Figure 18B:
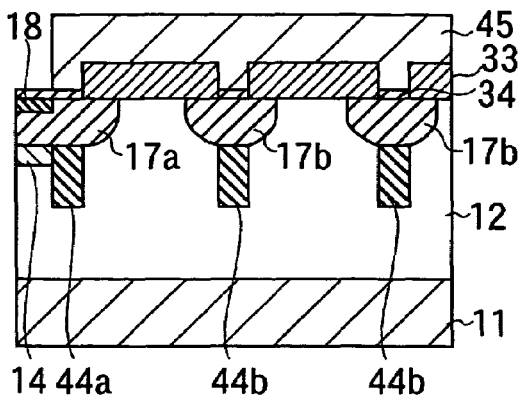

Then, as shown in FIGS. 18(a) and 18(b), a patterned resist film 45 is disposed on the surface of the processed substrate 10, and a second conductivity type impurity is irradiated while the gate insulating film 34 positioned in the widthwise center of the base diffusion region 17a is exposed. The second conductivity type impurity transmitted through the gate insulating film 34 forms a high concentration impurity layer 18 of the second conductivity type at the inside surface of the base diffusion region 17a.

The high concentration impurity layer 18 of the second conductivity type has a rectangular shape having its longer sides provided along the longitudinal direction of the base diffusion region 17a, and the longer sides of the high concentration impurity layer 18 and the longer sides of the base diffusion region 17a are parallel to one another.

Figure 19A:
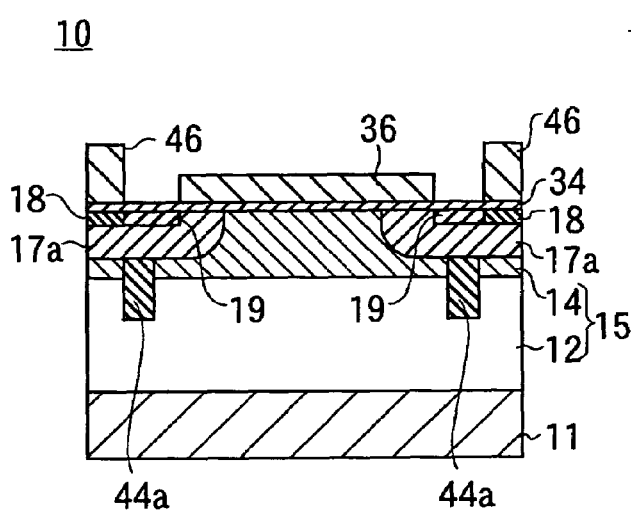
FIGS. 19(a) and 19(b) are views for illustrating the process of manufacturing the semiconductor device according to the invention (19)
Figure 19B:
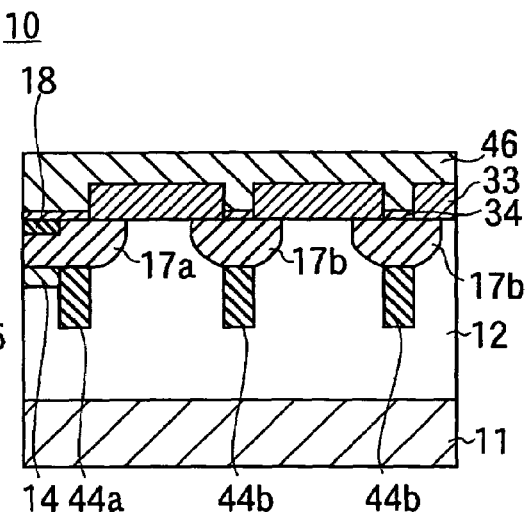

The longer side of the high concentration impurity layer 18 is provided a prescribed distance apart from the edge of the gate electrode film 36. The resist film 45 is removed, and another patterned resist film 46 is formed as shown in FIGS. 19(a) and 19(b). The surface of the gate insulating film 34, positioned between the longer side of the high concentration impurity layer 18 and the edge of the gate electrode film 36, is exposed while the other part thereof is covered; and an impurity of the first conductivity type is irradiated. The impurity is transmitted through the exposed part of the gate insulating film 34, and a high concentration impurity region 19 of the first conductivity type is formed at the inside surface of the base diffusion region 17a between the high concentration impurity region 18 of the second conductivity type and the gate electrode film 36.

Figure 20A:
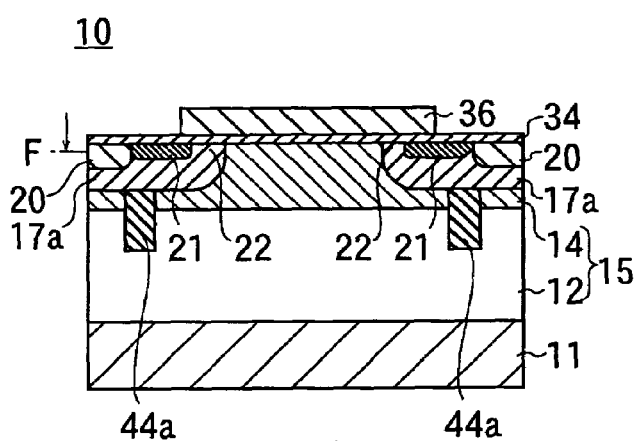
FIGS. 20(a) and 20(b) are views for illustrating the process of manufacturing the semiconductor device according to the invention (20)
Figure 20B:
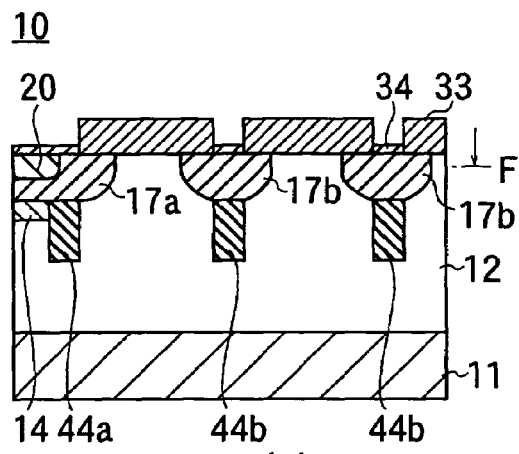

After the resist film 46 is removed, thermal treatment is carried out, so that the impurities contained in the high concentration impurity region 18 of the second conductivity type and the high concentration impurity region 19 of the first conductivity type both diffuse, and as shown in FIGS. 20(a) and 20(b), an Ohmic diffusion region 20 of the second conductivity type and a source diffusion region 21 of the first conductivity type are formed, respectively. The surface concentration of the Ohmic diffusion region 20 is higher than that of the base diffusion region 17a, and the source diffusion region 21 and the Ohmic diffusion region 20 form an Ohmic contact with a metal film.

Figure 32:
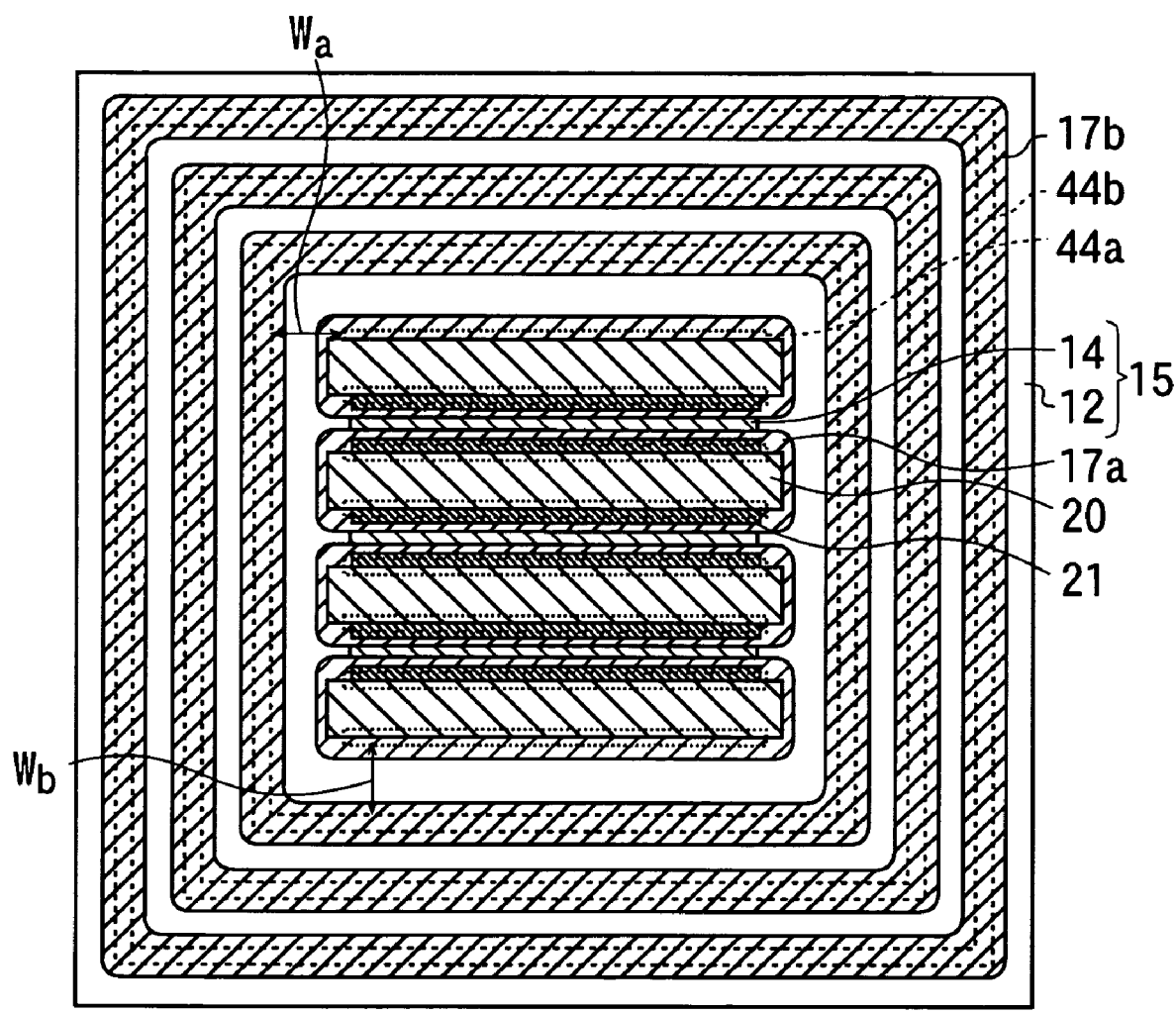
FIGS. 32 is a sectional view taken along the line F-F in FIGS. 20(a) and 20(b)

FIG. 32 is a sectional view taken along the line F-F in FIGS. 20(a) and 20(b).

The two-dimensional plan shapes of the Ohmic diffusion region 20 and the source diffusion region 21 have a size smaller than the base diffusion region 17a and a depth smaller than that of the base diffusion region 17a. The Ohmic diffusion region 20 and the source diffusion region 21 are positioned on the inner side of the base diffusion region 17a and not in contact with the conductive layer 14 and the growth layer 12.

At least one Ohmic diffusion region 20 and at least one source diffusion region 21 are formed in each of the base diffusion regions 17a.

The end of the source diffusion region 21 comes under the bottom of the gate electrode film 36 by lateral diffusion but does not come into contact with the end of the base diffusion region 17a, and the part of the base diffusion region 17a positioned under the bottom of the gate electrode film 36 and in contact with the gate insulating film 34 between the edge of the source diffusion region 21 and the edge of the base diffusion region 17a forms a channel region 22.

Figure 21A:
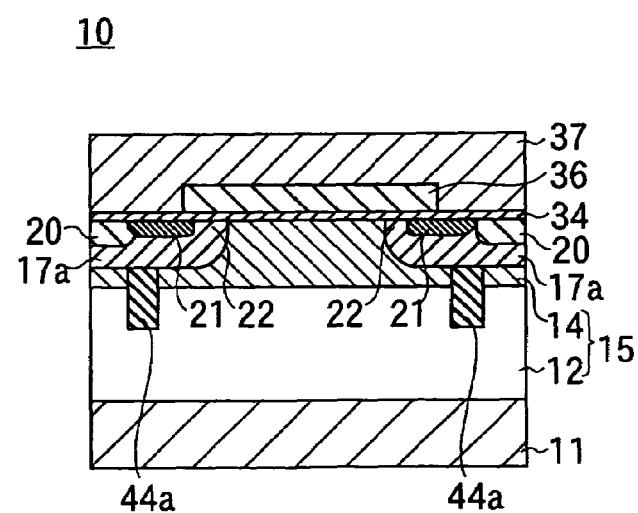
FIGS. 21(a) and 21(b) are views for illustrating the process of manufacturing the semiconductor device according to the invention (21)
Figure 21B:
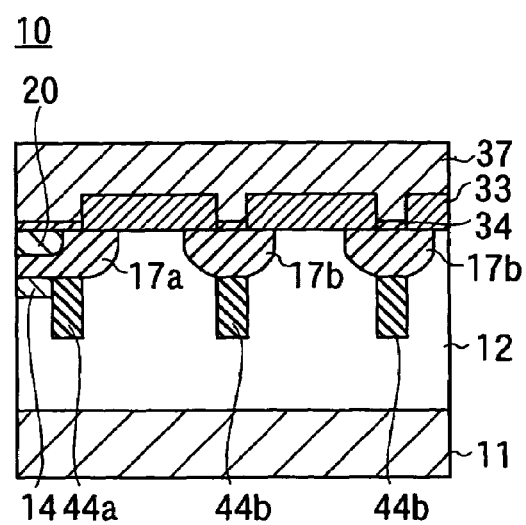
Figure 22A:
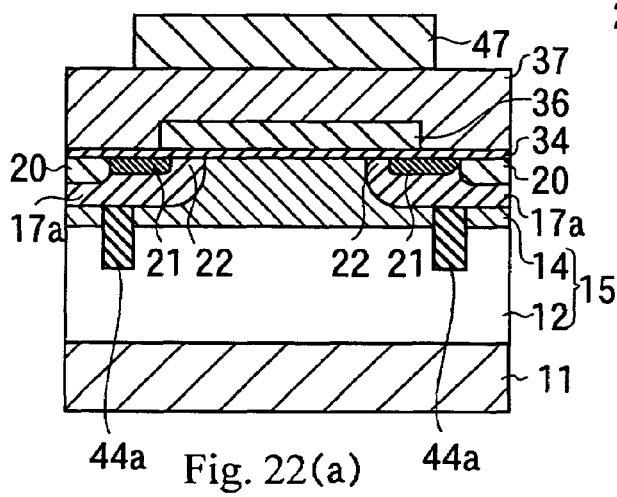
FIGS. 22(a) and 22(b) are views for illustrating the process of manufacturing the semiconductor device according to the invention (22)
Figure 22B:
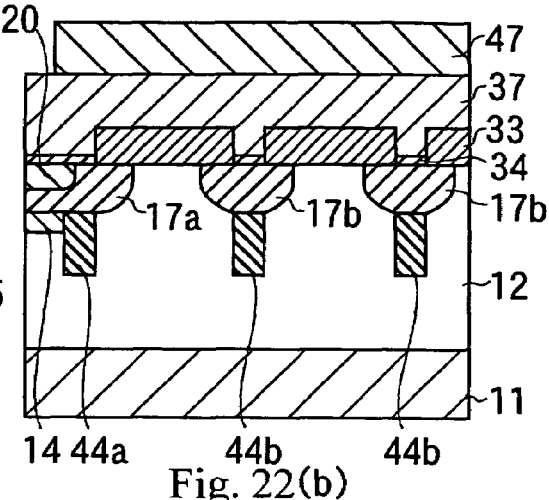
Figure 23A:
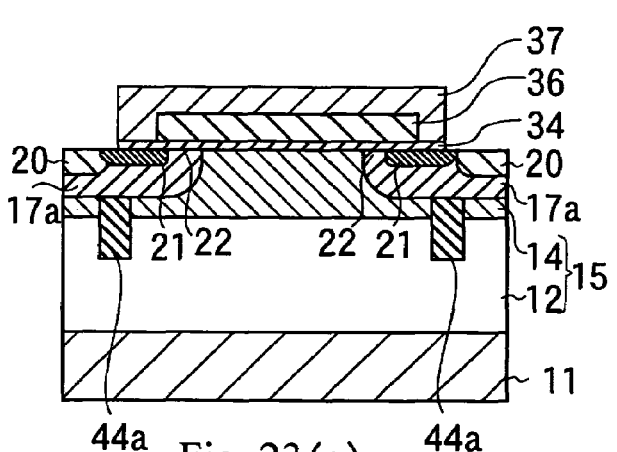
FIGS. 23(a) and 23(b) are views for illustrating the process of manufacturing the semiconductor device according to the invention (23)
Figure 23B:
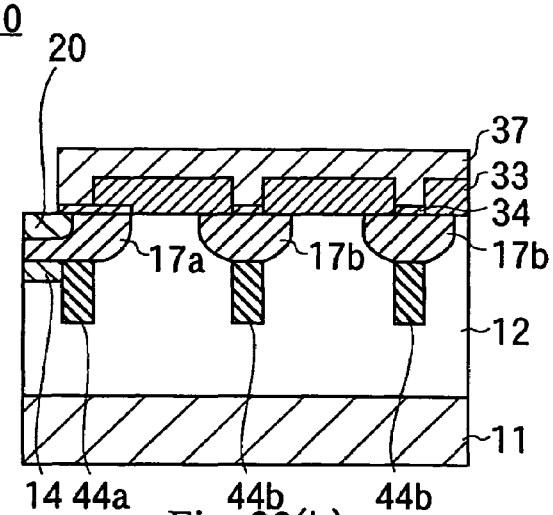
Figure 24A:
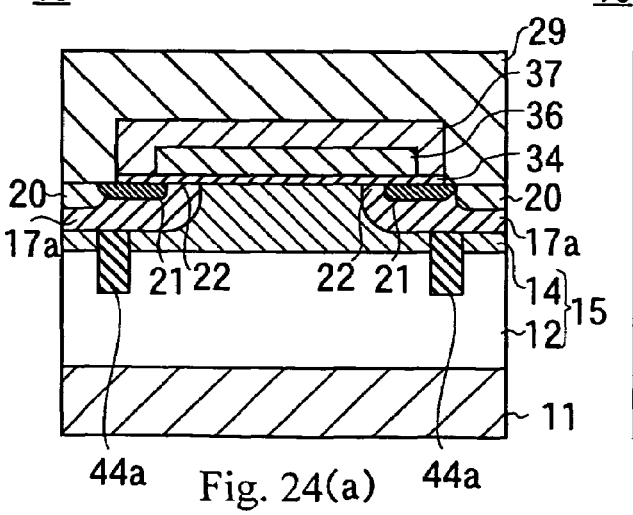
FIGS. 24(a) and 24(b) are views for illustrating the process of manufacturing the semiconductor device according to the invention (24)
Figure 24B:
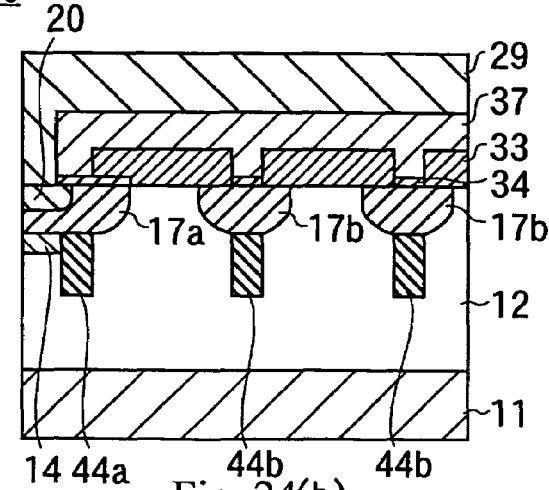

Then, as shown in FIGS. 21(a) and 21(b), after an interlayer insulating film 37 such as a silicon oxide film is formed on the surface of the substrate 10 by CVD or the like, a patterned resist film 47 is disposed on the gate electrode film 36 in the active region and the surface of the withstand voltage region as shown in FIGS. 22(a) and 22(b). The exposed interlayer insulating film 37 and the underlying gate insulating film 34 are etched to expose at least a part of the surface of the Ohmic diffusion region 20 and the source diffusion region 21 as shown in FIGS. 23(a) and 23(b). Then, as shown in FIGS. 24(a) and 24(b), a thin metal film 29 such as an aluminum film is formed and the part of the surface of the Ohmic diffusion region 20 and the part of the surface of the source diffusion region 21 are in contact with the thin metal film 29.

Figure 25A:
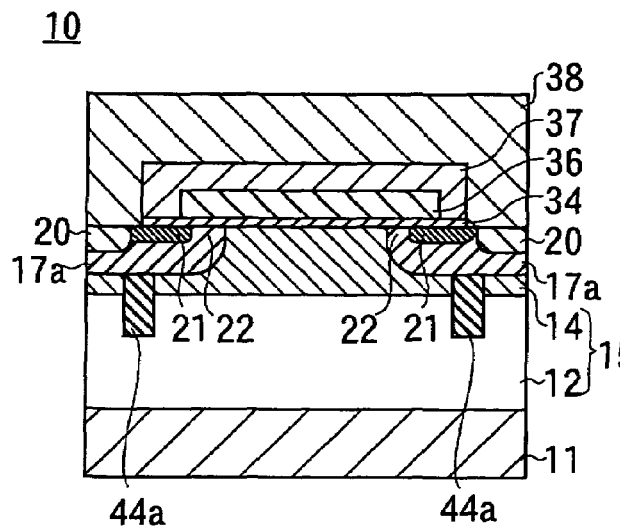
FIGS. 25(a) and 25(b) are views for illustrating the process of manufacturing the semiconductor device according to the invention (25)
Figure 25B:
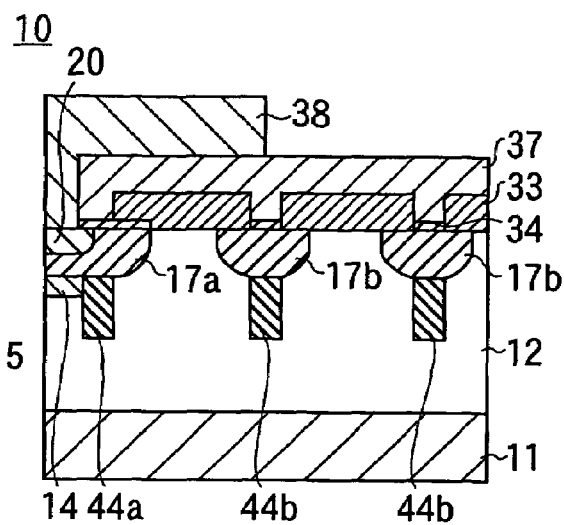

Then, a patterned resist film (not shown) is provided on the thin metal film 29, and the thin metal film 29 is patterned by etching, so that a source electrode film 38 is formed as shown in FIG. 25.

At the time of forming the source electrode film 38, a gate pad made of the metal film forming the source electrode film 38, insulated from the source electrode film 38, and connected to the gate electrode film 36 and a source pad made of a part of the source electrode film 38 are formed.

The source electrode film 38 is in Ohmic contact with the source diffusion region 21 and the Ohmic diffusion region 20; the source diffusion region 21 is directly electrically connected to the source electrode film 38; and the base diffusion region 17a is electrically connected to the source electrode film 38 through the Ohmic diffusion region 20.

The base buried region 44a is in contact with the base diffusion region 17a and thus electrically connected with the source electrode film 38. The source electrode film 38 is electrically insulated from the gate electrode film 36 by the interlayer insulating film 37, and not in contact with the conductive layer 14 and the growth layer 12.

Figure 26A:
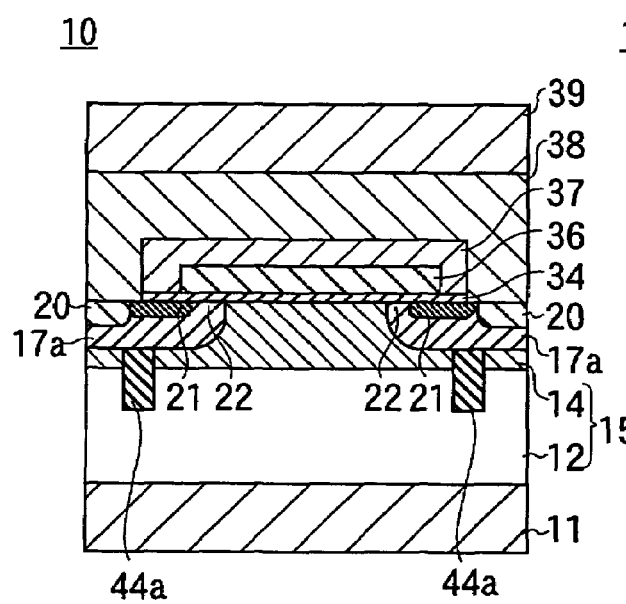
FIGS. 26(a) and 26(b) are views for illustrating the process of manufacturing the semiconductor device according to the invention (26)
Figure 26B:
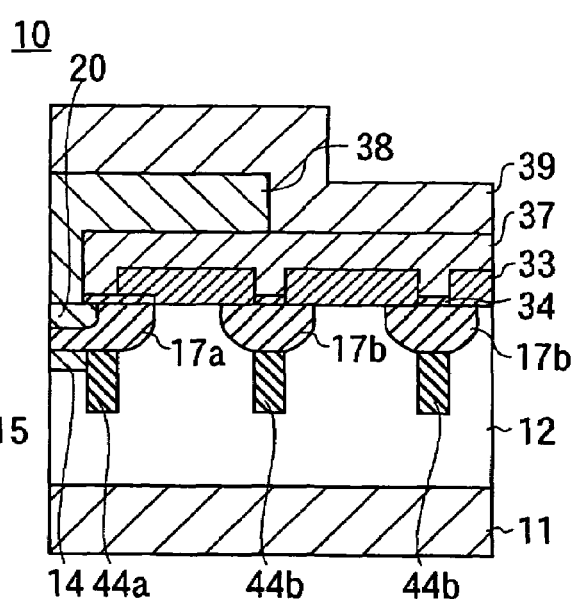

Then, as shown in FIGS. 26(a) and 26(b), a protective layer 39 made, for example, of a silicon oxide film is formed on the surface of the processed substrate 10, and the protection layer 39 is patterned by etching. The gate pad and the source pad are exposed by the patterning.

Figure 28:
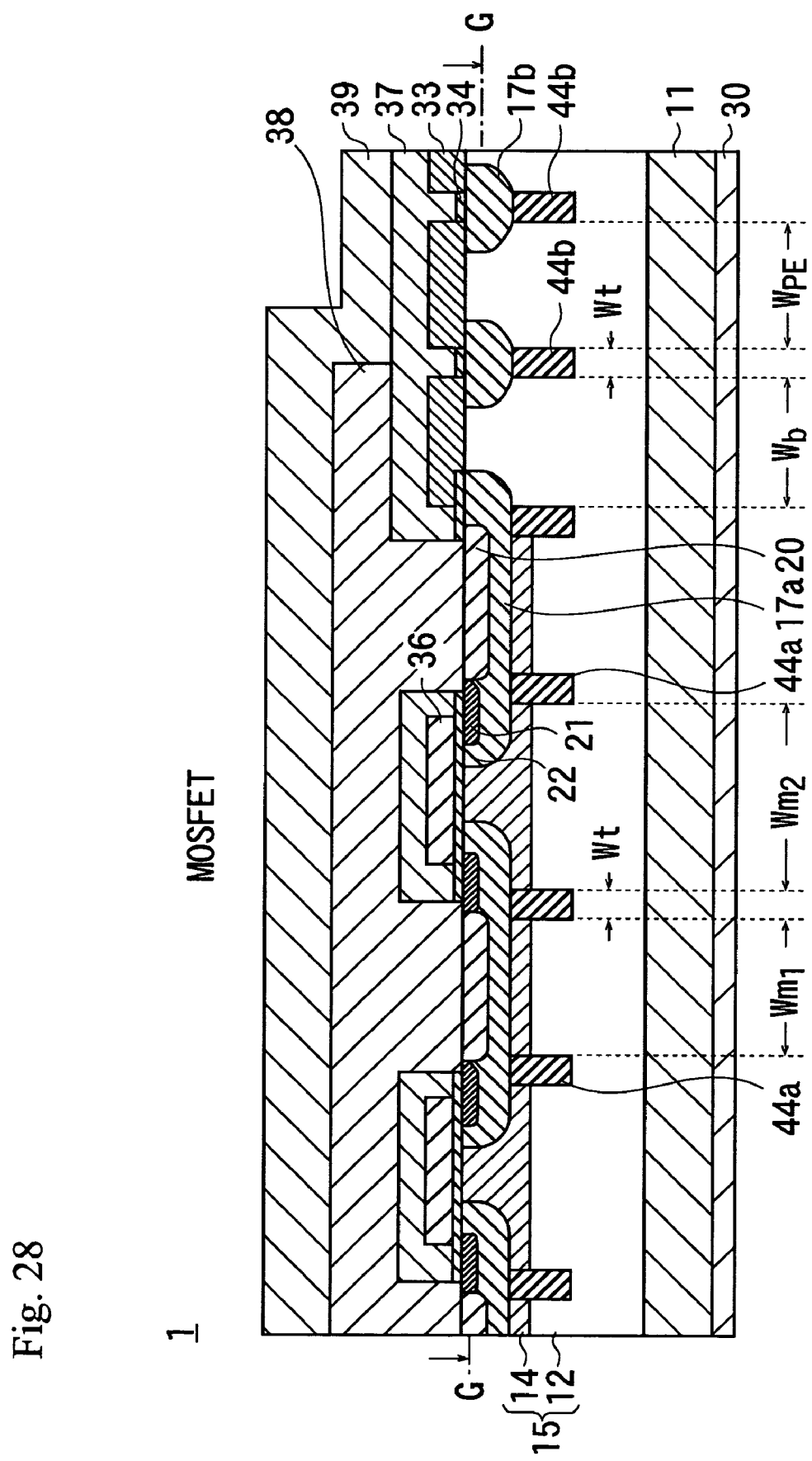
FIG. 28 is a sectional view of a withstand voltage region part in the semiconductor device according to the first embodiment of the invention.

Then, as shown in FIGS. 27 and 28, a metal film is formed on the exposed back surface of the semiconductor support layer 11, and the metal film forms the drain electrode film 30. After a dicing process, a plurality of semiconductor devices 1 is obtained from one wafer.

The drain electrode film 30 is in Ohmic contact with the semiconductor support layer 11 and the growth layer 12 and the conductive layer 14 are electrically connected to the drain electrode film 30 through the semiconductor support layer 11.

Note that the sectional view taken along line G-G in FIGS. 27 and 28 are the same as the sectional view taken along line F-F in FIGS. 20(a) and 20(b), which is shown in FIG. 32.

In the foregoing, the semiconductor device 1 according to the invention is a MOS transistor, while the invention may be applied to other kinds of semiconductor devices.

Figure 33:
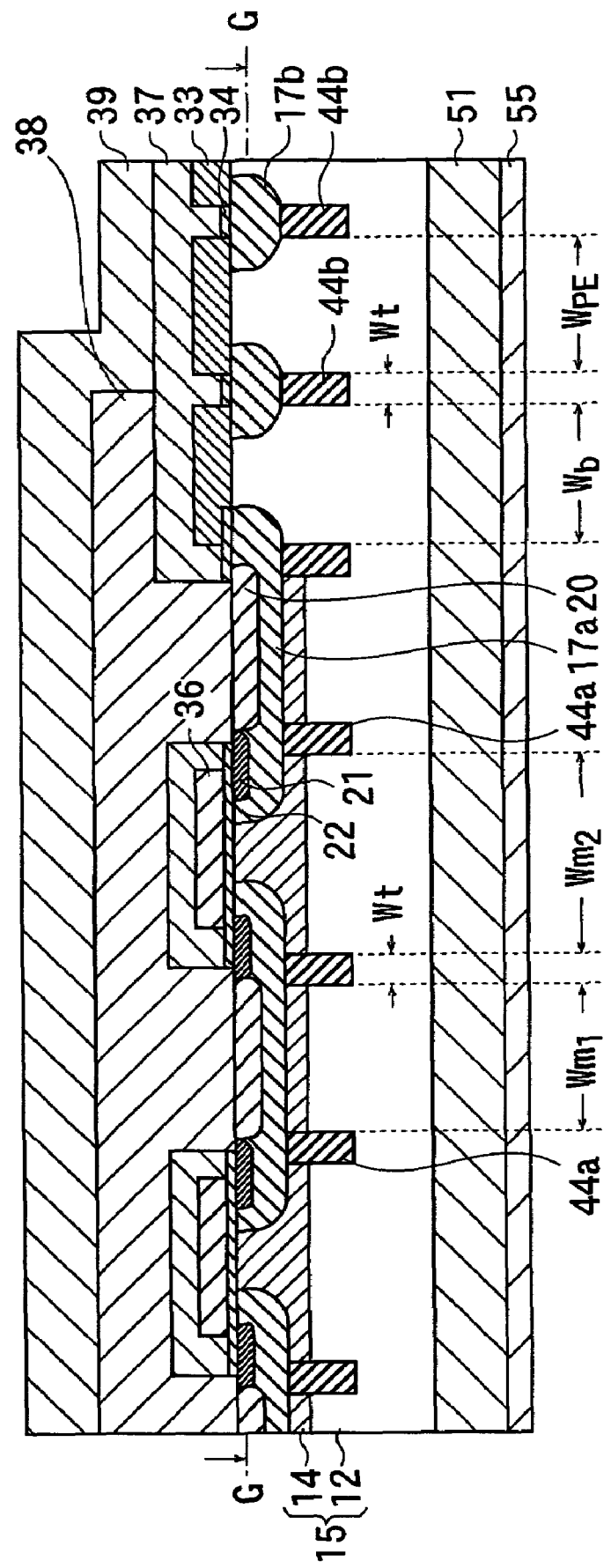
FIG. 33 is a sectional view for illustrating a semiconductor device according to a second embodiment of the invention.

The reference numeral 2 in FIG. 33 denotes a PN junction type IGBT semiconductor device according to a second embodiment of the invention. In the description of the semiconductor device 2 according to the second embodiment and semiconductor devices 3 and 4 as will be described as embodiments, the same elements as those of the semiconductor device 1 in the first embodiment are denoted by the same reference characters and will not be described. Among the following embodiments, the structure of the withstand voltage region at least in the semiconductor devices 2 and 3 according to the second and third embodiments is the same as that of the semiconductor 1 according to the first embodiment.

The semiconductor device 2 according to the second embodiment has a collector layer 51 of the second conductivity type in place of the support layer 11 of the first conductivity type and a growth layer 12 of the first conductivity type is provided on the collector layer 51. A collector electrode 55 in Ohmic contact with the collector layer 51 is formed on the back surface of the collector layer 51. The other structure is the same as that of the semiconductor device 1 according to the first embodiment.

In the semiconductor device 2, a PN junction is formed between the collector layer 51 and the growth layer 12. When the semiconductor device 2 turns on, the PN junction is forward biased, and minority carriers are injected from the collector layer 51 into the growth layer 12 so that the conduction resistance is lowered.

Figure 34:
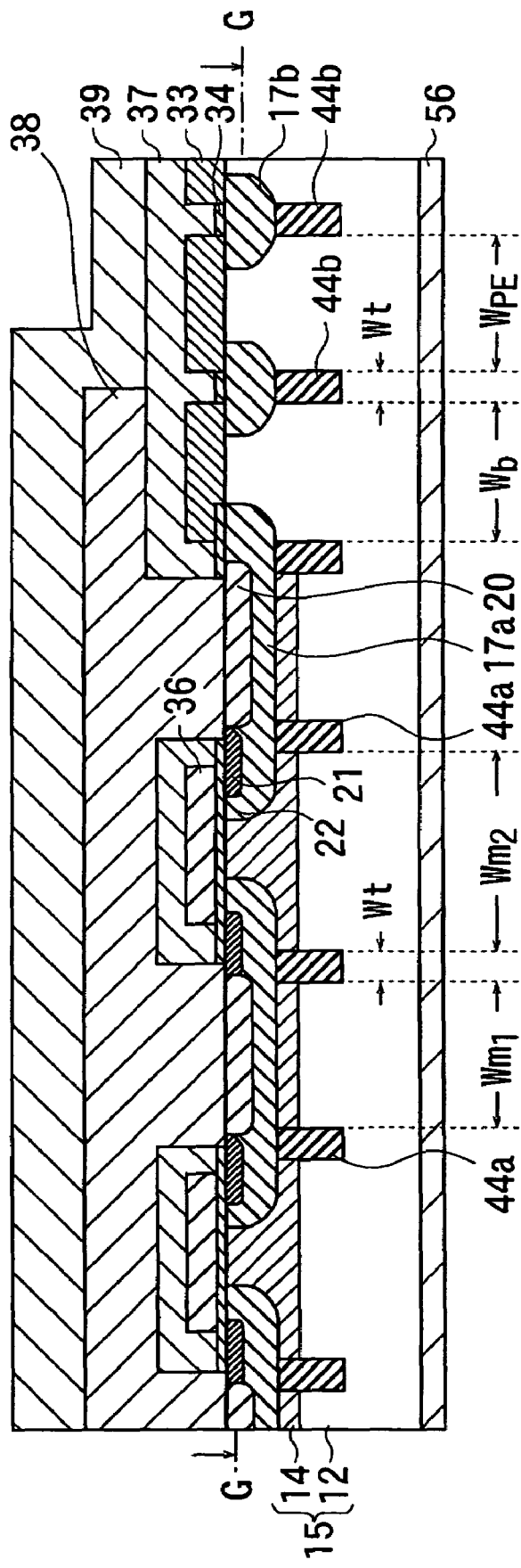
FIG. 34 is a sectional view for illustrating a semiconductor device according to a third embodiment of the invention.

The reference numeral 3 in FIG. 34 denotes a Schottky junction type IGBT semiconductor device according to the third embodiment of the invention.

In the semiconductor device 3, after the part corresponding to the semiconductor support layer 11 of the semiconductor device 1 according to the first embodiment is removed by polishing or the like, a metal film (such as, a chromium film forming a Schottky junction with the growth layer 12) is deposited on the surface of the growth layer 12 exposed by the polishing. The metal film forms a Schottky electrode film 56.

The Schottky junction has such a polarity that the junction is forward-biased in response to the conduction of the semiconductor device 3. When the Schottky junction is forward-biased, minority carriers are injected from the Schottky electrode film 56 into the growth layer 12, which lowers the conduction resistance.

Figure 35:
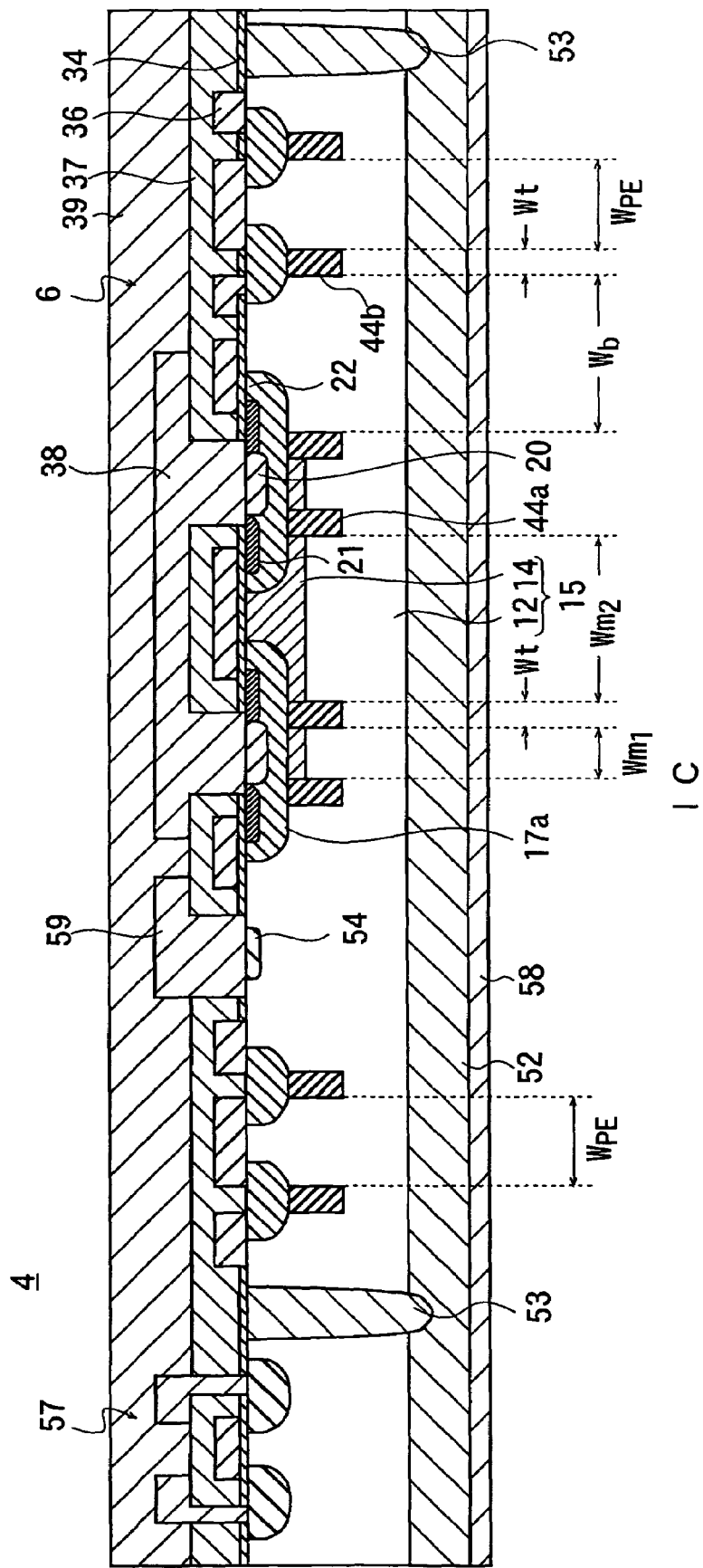
FIG. 35 is a sectional view for illustrating a semiconductor device according to a fourth embodiment of the invention.

The reference numeral 4 in FIG. 35 denotes the semiconductor device according to the fourth embodiment of the invention, and a growth layer 12 of the first conductivity type is epitaxially grown on a support substrate 52 of the second conductivity type.

The semiconductor device 4 has an isolation diffusion region 53 formed by diffusion from the surface of the resistance layer 15 and its bottom reaches the support substrate 52.

The isolation diffusion region 53 has a ring shape and surrounds the active region in which the base diffusion region 17a is disposed.

Inside the region surrounded by the isolation diffusion region 53, a conductive layer 14 is formed, and in the vicinity of the inner surface of the conductive layer 14, a drain diffusion region 54 of the first conductivity type simultaneously formed with the source diffusion region 21 is provided. A drain electrode film 59 formed simultaneously with the source electrode film 38 and electrically insulated from the source electrode film 38 is provided on the surface of the drain diffusion region 54, and these elements form a transistor 6.

On the outer side of the ring-shaped isolation diffusion region 53, semiconductor elements 57 (such as, a transistor and a diode for small signals) are formed, and a plurality of such semiconductor elements 57 form an electronic circuit (such as, a control circuit).

An earth electrode film 58 connected to a ground potential is formed on the surface of the support substrate 52. The gate electrode film 36 is connected to the semiconductor elements 57 on the outer side of the isolation diffusion region 53, and the transistor 6 is controlled by the control circuit formed by the semiconductor elements 57.

When the earth electrode film 58 is at the ground potential, a voltage is applied between the drain electrode film 59 and the source electrode film 38, and a voltage equal to or higher than the threshold voltage is applied to the gate electrode film 36, an inversion layer forms in the channel region 22 and conducts.

In the conduction state, current flows laterally inside the resistance layer 15 between the source electrode film 38 and the drain electrode film 59.

When the gate electrode film 36 attains a voltage less than the threshold voltage, a cutoff state is attained.

Both in the conduction state and in the cutoff state, the isolation diffusion region 53 and the resistance layer 15 are reversely biased, and the transistor 6 and the other semiconductor elements 57 are electrically isolated from one another.

For the semiconductor device according to the invention, a single crystal of silicon may be used as a single crystal of a semiconductor. Alternatively, other kinds of single crystals of semiconductors (such as, GaAs) may be used.

In the above described embodiments, there are the plurality of base diffusion regions 17a isolated from one another, while the base diffusion region 17a may be connected by a diffusion region of the second conductivity type and formed in a comb manner.

In the above described embodiments, the ring shaped guard buried regions 44b surrounding the base diffusion region 17a are not connected to the source electrode film 38 and the gate electrode film 36 and kept at a floating potential. The innermost guard buried region may be electrically connected with the source electrode film 38.

Figure 37:
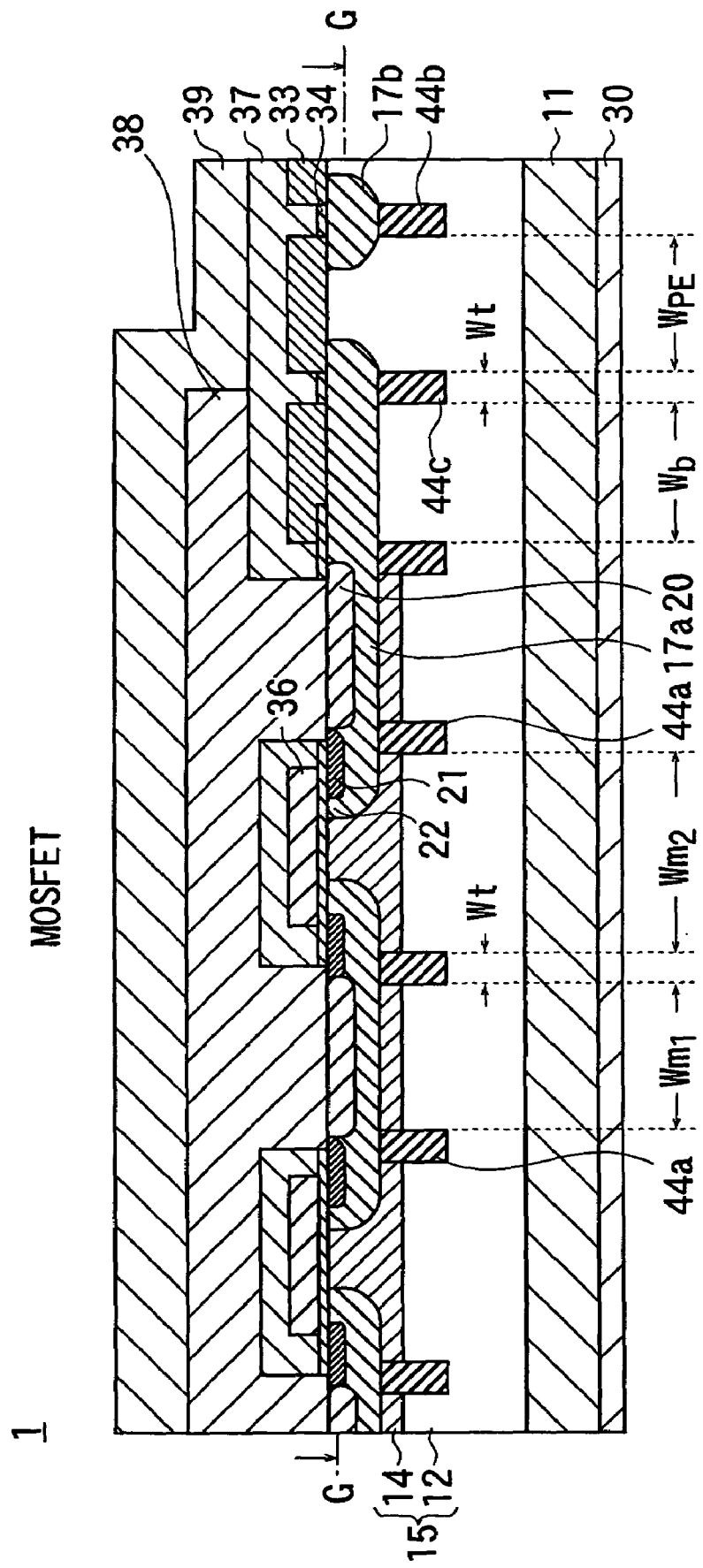
FIG. 37 is a view for illustrating an example in which the innermost guard buried region is connected to the ground potential.
Figure 38:
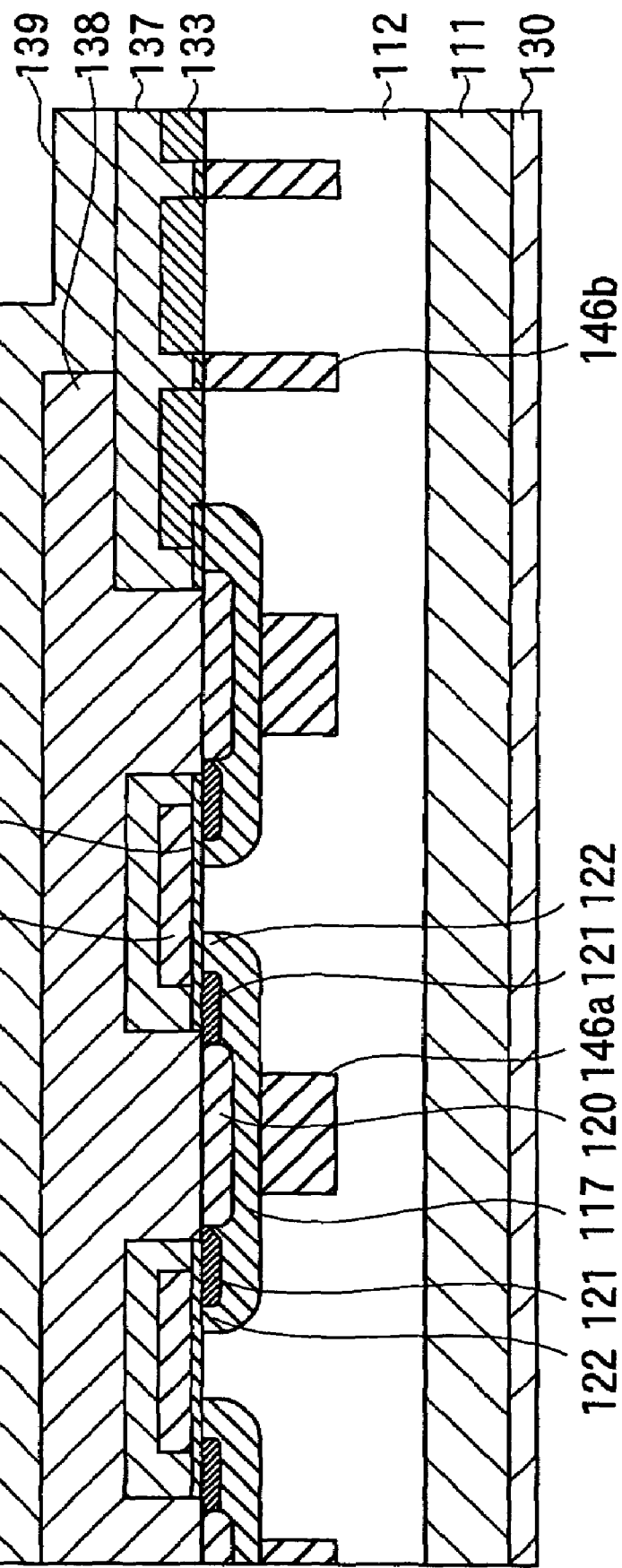
FIG. 38 is a sectional view for illustrating a conventional semiconductor device.

The reference character 44c in FIG. 37 shows the innermost guard buried region, and the base diffusion region 17a adjacent to the innermost guard buried region 44c is extended toward the outer circumference and in contact with the innermost guard buried region 44c.

As a result, when the source electrode film 38 is pulled to the ground potential, the innermost guard buried region 44c is also pulled to the ground potential. In this example, the guard buried region 44b concentrically surrounding the innermost guard buried region 44c is kept at the floating potential.

Comparing the case of connecting the innermost guard buried region 44c to the ground potential and the case of the innermost guard buried region 44c having floating potential, there is no difference with the breakdown voltage, while avalanche current can flow to the innermost guard buried region 44c too, and therefore the withstand strength against destruction is higher in the case in which the region is connected to the ground potential.

When two base buried regions 44a are disposed at the bottom of each single base diffusion region 17a, the impurity quantity $Q_1$ of the first conductivity type is $(Wm_1+Wm_2) \times N_1$, and the impurity quantity $Q_2$ of the second conductivity type is $2 \times Wt \times N_2$ in the region between the bottom of the base diffusion region 17a and the bottom of the base buried region 44a.

The RESURF condition for $Q_1=Q_2$ is satisfied if the following expression (3) holds:

$$(Wm_1+Wm_2) \times N_1 = 2 \times Wt \times N_2 \qquad (3)$$

where the widths $W_t$ of the buried regions 44a and 44b are equal.

Similarly, if the RESURF condition is established, in the guard ring region, the following expression (4) holds:

$$N_1 \times W_{PE} = Wt \times N_2 \qquad (4).$$

By eliminating $Wt \times N_2$ from the above two expressions, the following results:

$$N_1 \times W_{PE} = N_1(Wm_1+Wm_2)/2 \qquad (5)$$

and therefore:

$$W_{PE} = (Wm_1+Wm_2)/2 \qquad (6).$$

As described above, the RESURF condition is satisfied if the distance $W_{PE}$ between the guard buried regions 44b is half the sum of the distance $Wm_1$ between the base buried regions 44a under the same base diffusion region 17a and the distance $Wm_2$ between the base buried regions 44a under adjacent base diffusion regions 17a.

As in the foregoing, if settings are deviated from the RESURF condition, it is designed so that the expression (6) is established to start with, and then $Wm_1$, $Wm_2$, and $W_{PE}$ are set so that the expressions (a) and (b), (c) and (d), or (e) and (f) are established.

What is claimed is:

1. A semiconductor device, comprising:
   a resistance layer of a first conductivity type;
   a plurality of guard buried regions of a second conductivity type formed inside the resistance layer and concentrically disposed;
   a plurality of base diffusion regions of the second conductivity type disposed inside an innermost guard buried region and at least one of the plurality of base diffusion regions is positioned in the vicinity of an inner surface of the resistance layer;
   a source diffusion region of the first conductivity type formed in the vicinity of an inner surface of each of the base diffusion regions and the source diffusion region is positioned inside region of an edge of each of the base diffusion regions and has a depth shallower than each of the base diffusion regions;
   a channel region in the vicinity of the edge of each of the base diffusion regions and between the edge of each of the base diffusion regions and an edge of each of the source diffusion regions;
   a gate insulating film positioned at least on each of the channel regions;
   a gate electrode film positioned on the gate insulating film; and
   a plurality of base buried regions of the second conductivity type and a set of a plurality of the base buried regions is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions at a position deeper than the bottom of the base diffusion region have a relationship represented by the following expression (e):

$$Wm_1 < Wm_2 < W_{PE} \qquad (e),$$

the bottom of each of the base buried regions and the bottom of each of the guard buried regions being positioned substantially in the same depth, the bottoms of the respective base diffusion regions being positioned substantially in the same depth, and an impurity quantity $Q_1$ of the first conductivity type and an impurity quantity $Q_2$ of the second conductivity type included in a region inside a widthwise center of the innermost guard buried region and between the bottoms of the base buried region and the guard buried region and the bottom of the base diffusion region having a relationship represented by the following expression (f):

$$1.10 < Q_2/Q_1 \qquad (f).$$

2. A semiconductor device, comprising:

a resistance layer of a first conductivity type;

a plurality of guard buried regions of a second conductivity type formed inside the resistance layer and concentrically disposed;

a plurality of base diffusion regions of the second conductivity type disposed inside an innermost guard buried region and at least one of the plurality of base diffusion regions is positioned in the vicinity of an inner surface of the resistance layer;

a source diffusion region of the first conductivity type formed in the vicinity of an inner surface of each of the base diffusion regions and the source diffusion region is positioned inside region of an edge of each of the base diffusion regions and has a depth shallower than each of the base diffusion regions;

a channel region in the vicinity of the edge of each of the base diffusion regions and between the edge of each of the base diffusion regions and an edge of each of the source diffusion regions;

a gate insulating film positioned at least on each of the channel regions;

a gate electrode film positioned on the gate insulating film; and a plurality of base buried regions of the second conductivity type and a set of a plurality of base buried region is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions in a position deeper than the bottom of the base diffusion region have a relationship represented by the following expression (c):

$$W_{PE} < Wm_1 < Wm_2 \qquad (c),$$

the bottom of each of the base buried regions and the bottom of each of the guard buried regions being positioned substantially in the same depth, the bottoms of the respective base diffusion regions being positioned substantially in the same depth, and an impurity quantity $Q_1$ of the first conductivity type and an impurity quantity $Q_2$ of the second conductivity type included in a region inside of a widthwise center of the innermost guard buried region and between the bottoms of the base buried region and the guard buried region and the bottom of the base diffusion region having a relationship represented by the following expression (d):

$$Q_2/Q_1 < 0.92 \qquad (d).$$

3. A semiconductor device, comprising:

a resistance layer of a first conductivity type;

a plurality of guard buried regions of a second conductivity type formed inside the resistance layer and concentrically disposed;

a plurality of base diffusion regions of the second conductivity type disposed inside an innermost guard buried region and at least one of the plurality of base diffusion regions is positioned in the vicinity of an inner surface of the resistance layer;

a source diffusion region of the first conductivity type formed in the vicinity of an inner surface of each of the base diffusion regions and the source diffusion region is positioned inside region of an edge of each of the base diffusion regions and has a depth shallower than each of the base diffusion regions;

a channel region in the vicinity of the edge of each of the base diffusion regions and between the edge of each of the base diffusion regions and an edge of each of the source diffusion regions;

a gate insulating film positioned at least on each of the channel regions;

a gate electrode film positioned on the gate insulating film; and a plurality of base buried regions of the second conductivity type and a set of a plurality of the base buried regions is provided at the bottom of each of the base diffusion regions and connected to the respective base diffusion regions, wherein a distance $Wm_1$ between adjacent base buried regions at the bottom of the same base diffusion region, a distance $Wm_2$ between adjacent base buried regions at the bottoms of different base diffusion regions, and a distance $W_{PE}$ between the guard buried regions at a position deeper than the bottom of the base diffusion region have a relationship represented by the following expression (a):

$$Wm_1 < W_{PE} < Wm_2 \qquad (a),$$

the bottom of each of the base buried regions and the bottom of each of the guard buried regions being positioned substantially in the same depth, the bottoms of the respective base diffusion regions being positioned substantially in the same depth, and an impurity quantity $Q_1$ of the first conductivity type and an impurity quantity $Q_2$ of the second conductivity type included in the region inside a widthwise center of the innermost guard buried region and between the bottoms of the base buried region and the guard buried region and the bottom of the base diffusion region having a relationship represented by the following expression (b):

$$0.90 < Q_2/Q_1 \qquad (b).$$

4. The semiconductor device according to claim 1, wherein
each of the guard buried regions has a ring-shaped groove formed in the resistance layer and a semiconductor material of the second conductivity type filled in the ring-shaped groove.

5. The semiconductor device according to claim 1, wherein
each of the base buried regions has a groove formed in the resistance layer and a semiconductor material of the second conductivity type filled in the groove.

6. The semiconductor device according to claim 1, further comprising:
a guard diffusion region of the second conductivity type having a width larger than that of the guard buried region disposed on the top of each of the guard buried regions,
wherein each of the guard buried regions and the guard diffusion region connected thereto form a guard ring region, and
wherein a width of an upper part of the guard ring region is wider than that of a lower part thereof.

7. The semiconductor device according to claim 1,
wherein each of the base diffusion regions and the base buried region are formed long and narrow,
wherein the base diffusion regions are disposed parallel to one another, and
wherein the base buried regions are disposed parallel to one another along a longitudinal direction of each of the base diffusion regions.

8. The semiconductor device according to claim 1, wherein
each of the guard buried regions is formed in a rectangular or square ring shape,
wherein adjacent sides of the guard buried regions are disposed parallel to one another, and
wherein each of the base buried regions is disposed parallel to the two sides parallel to each other among the four sides of each of the guard buried regions.

9. The semiconductor device according to claim 1, wherein
a distance $W_b$ between an inner circumferential edge of the innermost guard buried region among the guard buried regions and an edge of a longer side of the base buried region opposing parallel to the guard buried region, and the distances $Wm_1$ and $Wm_2$ have a relationship represented by the following expression (g):

$$Wm_1 < W_b < Wm_2 \qquad (g).$$

10. The semiconductor device according to claims 1, wherein:
the base buried region is formed long and narrow, and
a distance $W_a$ between both ends of the base buried region in the longitudinal direction and the innermost guard buried region is substantially half the distance $W_b$ between the inner circumferential edge of the innermost guard buried region among the guard buried regions and the edge of the longer side of the base buried region opposing parallel to the guard buried region.

11. The semiconductor device according to claim 1, wherein:
the base buried region is formed long and narrow, and
both ends of the base buried region in the longitudinal direction are connected to the innermost guard buried region.

12. The semiconductor device according to claim 1, wherein
each base buried region is equal in width.

13. The semiconductor device according to claim 1, wherein
each guard buried region is equal in width.

14. The semiconductor device according to claim 1, wherein:
each base buried region is equal in width,
each guard buried regions is equal in width, and
the base buried region and the guard buried region are equal in width.

\* \* \* \* \*